(12) United States Patent
Li et al.

(10) Patent No.: US 12,255,236 B2
(45) Date of Patent: Mar. 18, 2025

(54) SELF-ALIGNED ACTIVE REGIONS AND PASSIVATION LAYER AND METHODS OF MAKING THE SAME

(71) Applicant: Taiwan Semiconductor Manufacturing Company Limited, Hsinchu (TW)

(72) Inventors: Hung Wei Li, Hsinchu (TW); Mauricio Manfrini, Zhubei (TW); Sai-Hooi Yeong, Zhubei (TW); Yu-Ming Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/446,541

(22) Filed: Aug. 9, 2023

(65) Prior Publication Data

US 2023/0387224 A1 Nov. 30, 2023

Related U.S. Application Data

(63) Continuation of application No. 17/227,460, filed on Apr. 12, 2021, now Pat. No. 11,817,485.

(Continued)

(51) Int. Cl.
*H01L 29/417* (2006.01)
*H01L 21/768* (2006.01)
(Continued)

(52) U.S. Cl.
CPC .. *H01L 29/41733* (2013.01); *H01L 21/76802* (2013.01); *H01L 21/76877* (2013.01);
(Continued)

(58) Field of Classification Search
CPC ............. H01L 21/76802; H01L 21/768; H01L 21/76877; H01L 21/02365; H01L 21/441;
(Continued)

(56) References Cited

U.S. PATENT DOCUMENTS 5,654,568 A * 8/1997 Nakao ................... H01L 29/792
257/295
10,460,984 B2 * 10/2019 Kurata .............. H01L 21/02063
(Continued)

FOREIGN PATENT DOCUMENTS

JP 2007294913 A 11/2007
KR 20110010384 A 2/2011
(Continued)

OTHER PUBLICATIONS

Korean Patent and Trademark Office, Application No. 10-2021-0075960, 2nd Office Action mailed Aug. 22, 2023, 6 pages.
(Continued)

*Primary Examiner* — Nikolay K Yushin
(74) *Attorney, Agent, or Firm* — The Marbury Law Group, PLLC

(57) ABSTRACT

Field effect transistors and method of making. The field effect transistor includes a pair of active regions over a channel layer, a channel region formed in the channel layer and located between the pair of active regions, and a pair of contact via structures electrically connected to the pair of active regions. The contact via structure is formed in an interlayer dielectric layer that extends over the channel layer.

20 Claims, 26 Drawing Sheets

Related U.S. Application Data

(60) Provisional application No. 63/042,579, filed on Jun. 23, 2020.

(51) Int. Cl.
   *H01L 29/40* (2006.01)
   *H01L 29/66* (2006.01)
   *H01L 29/786* (2006.01)

(52) U.S. Cl.
   CPC ...... *H01L 29/401* (2013.01); *H01L 29/66969* (2013.01); *H01L 29/7869* (2013.01)

(58) Field of Classification Search
   CPC ......... H01L 21/76831; H01L 21/76897; H01L 23/528; H01L 23/538; H01L 23/15; H01L 23/5283; H01L 27/1207; H01L 27/12; H01L 27/0207; H01L 29/41733; H01L 29/417; H01L 29/401; H01L 29/40; H01L 29/66969; H01L 29/66; H01L 29/7869; H01L 29/786; H01L 29/24; H01L 29/16; H01L 29/18; H01L 29/20; H01L 29/22; H01L 29/78; H01L 29/665; H01L 29/0847; H01L 29/1079; H01L 29/7833; H01L 29/08; H01L 29/78618; H01L 29/7725; H01L 29/775; H01L 29/778; H01L 29/0653; H10B 51/40; H10B 51/30; H10B 51/10; H10B 51/20; H10B 53/40; H10B 53/00; H10B 61/22; H10B 61/00; H10B 61/34; H10B 61/80; H10B 63/30; H10B 63/00; H10B 61/845; H10B 53/10; H10B 61/20; G06F 30/00; G06F 30/392; G06F 30/398; G06F 30/394
   See application file for complete search history.

(56) References Cited

U.S. PATENT DOCUMENTS

| | | |
|---|---|---|
| 2004/0142283 A1 | 7/2004 | Inoue et al. |
| 2016/0307777 A1* | 10/2016 | Kurata .................. H01L 27/124 |
| 2016/0308008 A1 | 10/2016 | Yeo et al. |
| 2018/0006056 A1 | 1/2018 | Bae et al. |
| 2018/0053763 A1 | 2/2018 | Liu et al. |
| 2019/0027489 A1 | 1/2019 | Orimoto et al. |
| 2019/0103401 A1 | 4/2019 | Yoshida et al. |
| 2020/0098880 A1 | 3/2020 | Sharma et al. |

FOREIGN PATENT DOCUMENTS

| | | |
|---|---|---|
| KR | 1020110010384 A | 2/2011 |
| WO | 2018111247 A1 | 6/2018 |
| WO | 20180111247 A1 | 6/2018 |

OTHER PUBLICATIONS

Korean Patent and Trademark Office, Application No. 10-2021-0075960, Notice of Opinion Submission mailed Dec. 22, 2023, 10 pages.
Taiwan Patent and Trademark Office; Taiwan Application No. 110121062, Office Action dated Jan. 10, 2022, 4 pages.
Korean Patent and Trademark Office, Application No. 10-2021-0075960, First Examination Report mailed Feb. 16, 2023, 5 pages.
German Patent and Trademark Office; German Application No. 102021109577.8, Office Action dated May 8, 2023, 8 pages.
Chinese Patent and Trademark Office, Application No. 1202110692352.8, First Office Action mailed Dec. 27, 2023, 6 pages.
Korean Patent and Trademark Office, KR Application No. 10-2021-0075960, Notice of Allowance mailed Jul. 18, 2024, 8 pages.

* cited by examiner

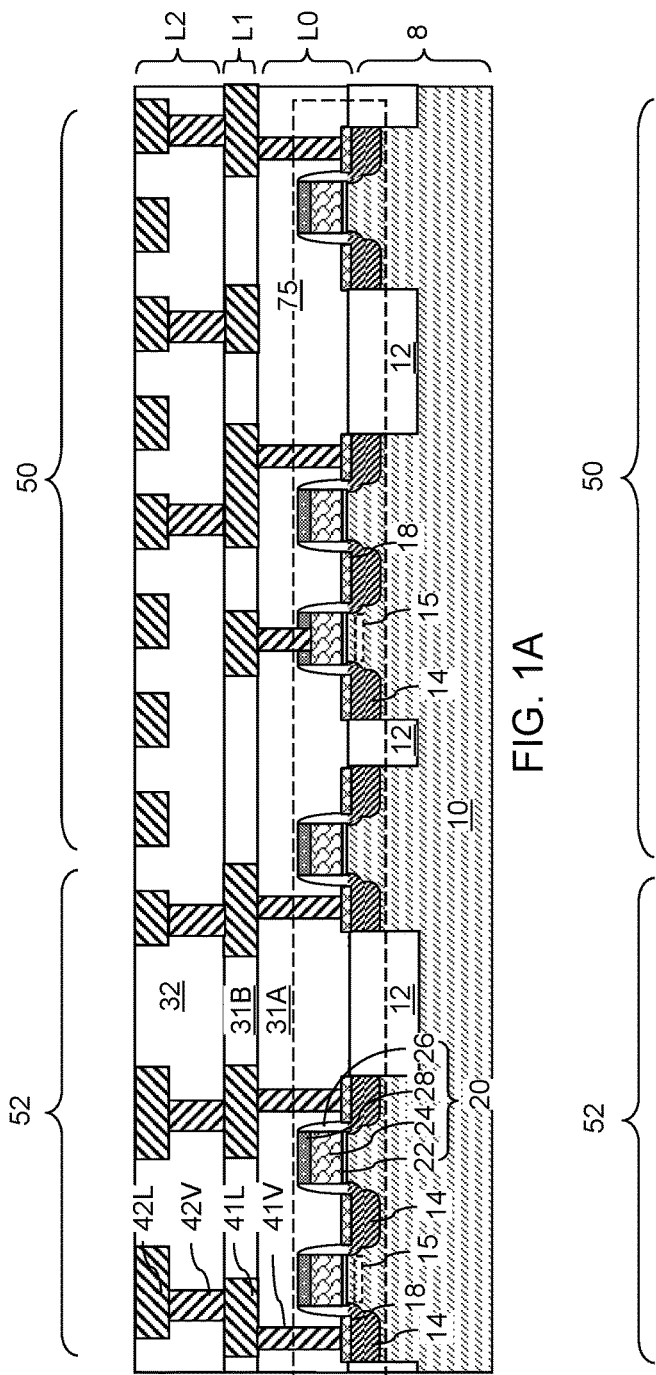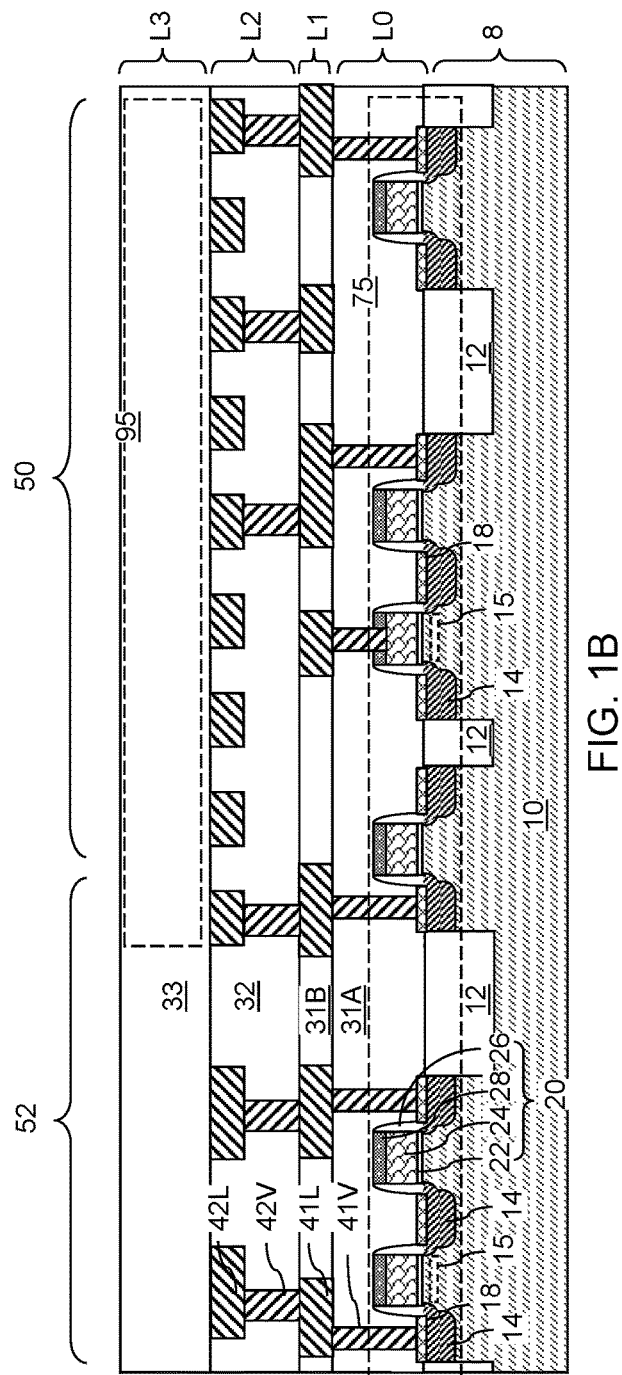

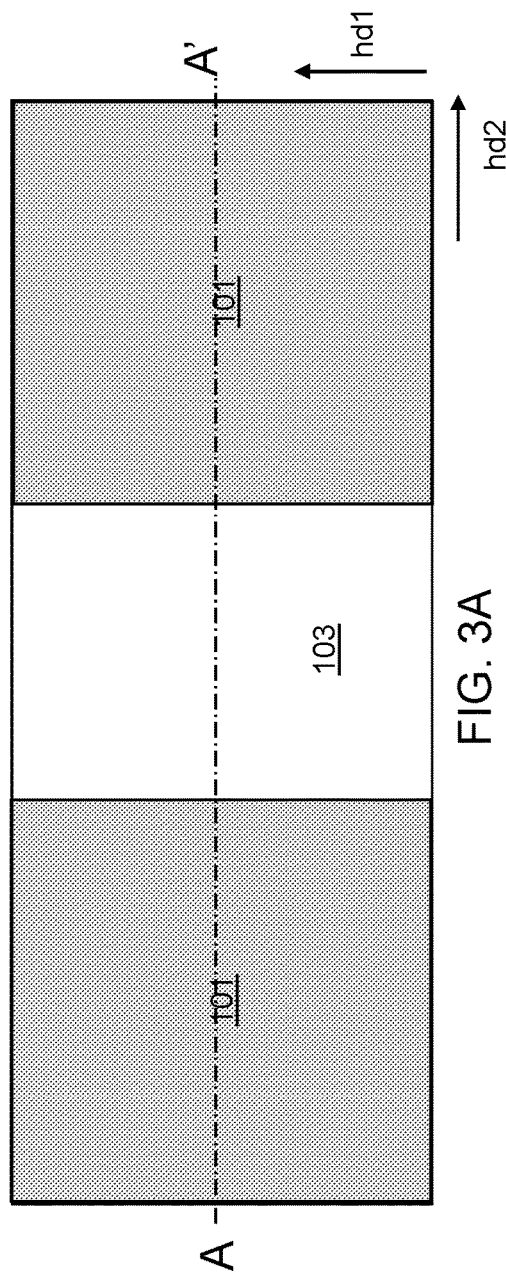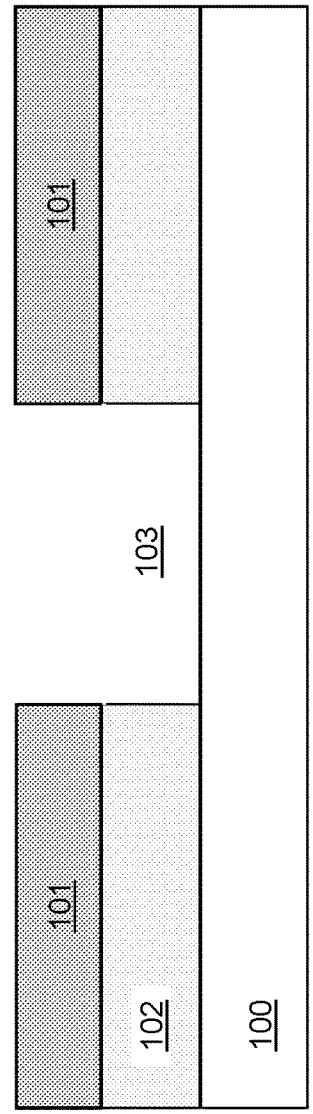

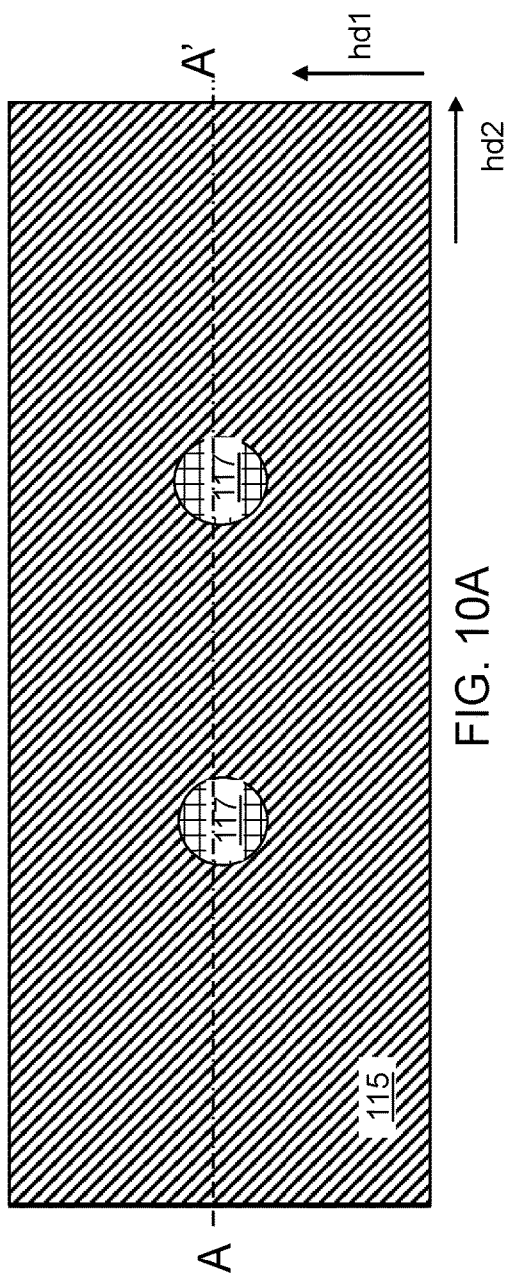
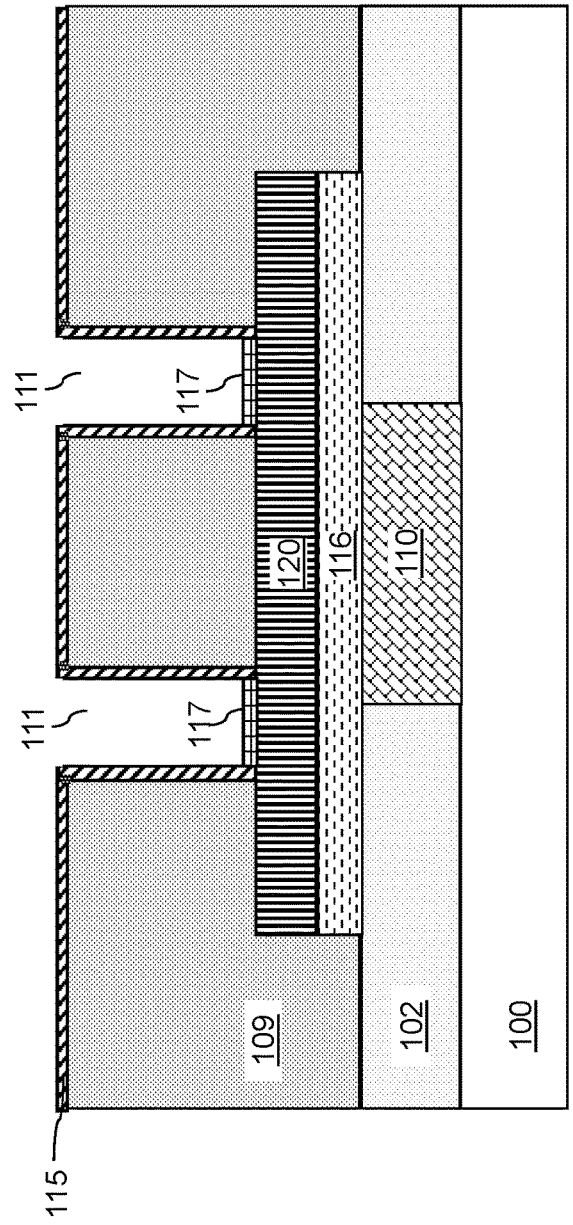
FIG. 10A
FIG. 10B

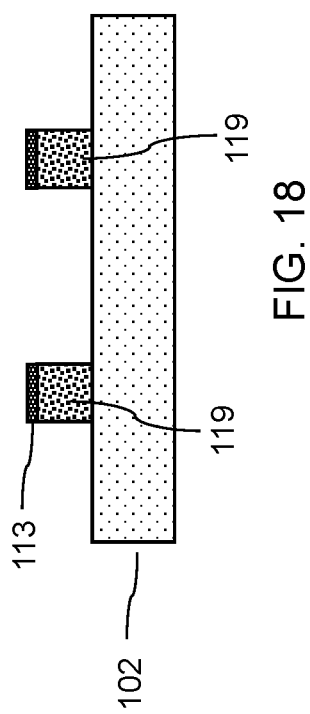

SELF-ALIGNED ACTIVE REGIONS AND PASSIVATION LAYER AND METHODS OF MAKING THE SAME

RELATED APPLICATIONS

This application is a continuation of U.S. patent application Ser. No. 17/227,460 entitled "Self-Aligned Active Regions and Passivation Layer and Methods of Making The Same" filed on Apr. 12, 2021, which claims priority to U.S. Provisional Patent Application No. 63/042,579 entitled "Formation of Self-Aligned N-Doped Region and Passivation Layer" filed on Jun. 23, 2020, the entire contents of both of which are hereby incorporated by reference for all purposes.

BACKGROUND

In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) of fabrication may be advantageous because functionality may be added at the BEOL while valuable chip area may be made available in the FEOL. Thin film transistors (TFT) made of oxide semiconductors are an attractive option for BEOL integration since TFTs may be processed at low temperatures and thus, will not damage previously fabricated devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a first exemplary structure prior to formation of an array of TFTs according to an embodiment of the present disclosure.

FIG. 1B is a vertical cross-sectional view of the first exemplary structure during formation of the BEOL transistors according to an embodiment of the present disclosure.

FIG. 3A is a plan view of an intermediate structure of a transistor after the formation of a word line trench in the first dielectric layer according to various embodiments of the present disclosure.

FIG. 3B is a vertical cross-sectional view taken along line A-A' of FIG. 3A according to a various embodiments of the present disclosure.

FIG. 10A is a plan view of an intermediate structure of a transistor after heating the intermediate structure illustrated in FIGS. 9A and 9B to react the metal with the IDL layer and the channel layer according to an embodiment of the present disclosure.

FIG. 10B is a vertical cross-sectional view taken along line A-A' of FIG. 10A according to a various embodiments of the present disclosure.

FIG. 18 is a vertical cross-sectional view illustrating forming contact via structures topped with a metal layer according to an embodiment of the present disclosure.

DETAILED DESCRIPTION

Figure 1C:
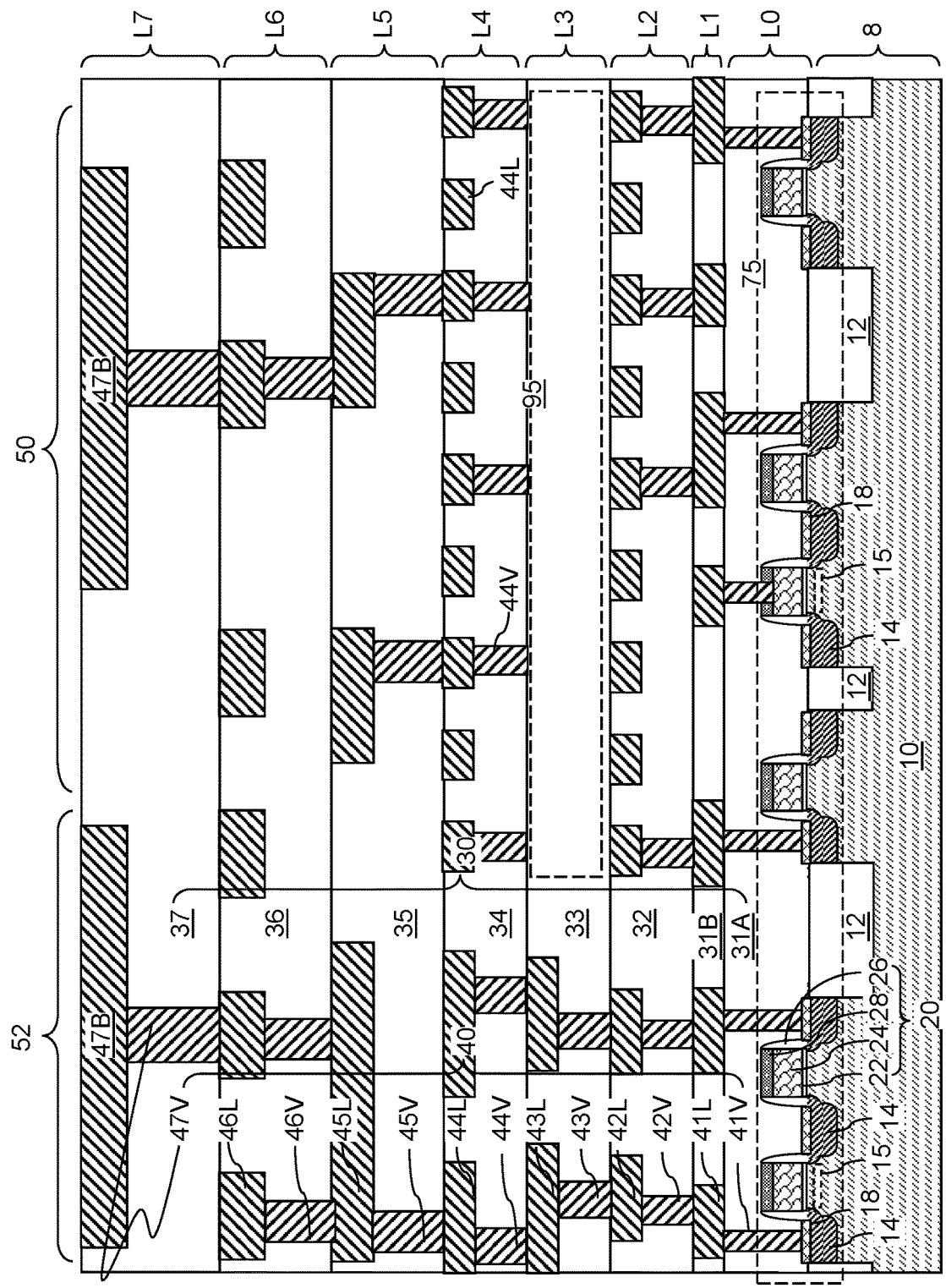
FIG. 1C is a vertical cross-sectional view of the first exemplary structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and in particular, embodiments of the present disclosure are drawn to field effect transistors with self-aligned active regions and a self-aligned protection layer lining contact via structures of the transistor. The self-aligned active regions and the self-aligned protection layer may protect the active regions 117 and aid in doping of the self-aligned active regions 117. In various embodiments, the transistor may be a bottom gate field effect transistor with the self-aligned passivation layer located on top of the channel layer. In other embodiments, the transistor may be a top gate field effect transistor with the self-aligned passivation region located on the bottom of the channel layer. In various embodiments, the transistors may include self-aligned protection layer lining the contact via structures. In other embodiments, the transistors may include an additional lower protection layer over the channel layer.

In some applications, transistors may be fabricated in a BEOL position. By fabricating the transistors in the BEOL position, functionality may be added at the BEOL while valuable chip area may be made available in the FEOL. Moreover, transistors that use metal oxide semiconductors may be an attractive option for BEOL integration since such transistors may be processed at low temperatures and thus, will not damage previously fabricated devices. While fabricating transistors in the BEOL protects the transistors from a number of harsh conditions, BEOL transistors may still be subject to gases in the ambient environment during the formation of other BEOL devices. For example, BEOL transistor may be exposed to plasma and air in the ambient environment. Ambient environment gases such as hydrogen may corrupt layers of the BEOL transistors and degrade the effectiveness of fabricated devices. Accordingly, the various embodiments disclosed herein seek to protect the transistors by incorporating a self-aligned passivation layer to protect a channel region.

Referring to FIG. 1A, a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-oninsulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a FEOL operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors such as thin film transistors to be subsequently formed.

Various interconnect-level structures may be subsequently formed, which are formed prior to formation of an array of field effect transistors and are herein referred to as lower interconnect-level structures (L0, L1, L2). In case a two-dimensional array of transistors is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric layer 31B and first metal lines 41L formed within the first interconnect level dielectric layer 31B. The first interconnect level dielectric layer 31B is also referred to as a first line-level dielectric layer. The first metal lines 41L may contact a respective one of the contact via structures 41V. The second interconnect-level structure L2 includes a second interconnect level dielectric layer 32, which may include a stack of a first via-level dielectric material layer and a second line-level dielectric material layer or a line-and-via-level dielectric material layer. The second interconnect level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect level dielectric layer 32.

Referring to FIG. 1B, an array 95 of non-volatile memory cells and selector devices may be formed in the memory array region 50 over the second interconnect-level structure L2. The details for the structure and the processing steps for the array 95 of non-volatile memory cells and selector devices are subsequently described in detail below. A third interconnect level dielectric layer 33 may be formed during formation of the array 95 of non-volatile memory cells and selector devices. The set of all structures formed at the level of the array 95 of non-volatile memory cells and selector devices transistors is herein referred to as a third interconnect-level structure L3.

Referring to FIG. 1C, third interconnect-level metal interconnect structures (43V, 43L) may be formed in the third interconnect level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric layer 34 having formed therein fourth interconnect-level metal interconnect structures (44V, 44L), which may include third metal via structures 44V and fourth metal lines 44L. The fifth interconnect-level structure L5 may include a fifth interconnect level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric layer may be referred to as an interconnect level dielectric (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and selector devices may be formed as a component of a third interconnect-level structure L3, embodiments are expressly contemplated herein in which the array 95 of non-volatile memory cells and selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and selector devices may be provided within multiple interconnect-level structures in the memory array region 50. While the present disclosure is described employing an embodiment in which an array of non-volatile memory cells and selector devices may be formed in a single interconnect-level structure, embodiments are expressly contemplated herein in which an array 95 of non-volatile memory cells and selector devices may be formed over two vertically adjoining interconnect-level structures.

Conventional transistors include source and drain electrodes that contact a channel layer and overlap with a gate electrode that is separated from the channel by a gate insulating layer. However, during manufacturing, a channel region of the channel layer may be degraded by processing conditions, such as deposition process plasma, and/or contact with air. In addition, it may be difficult to precisely control the formation of an $N^+$ doped region.

Figure 2A:
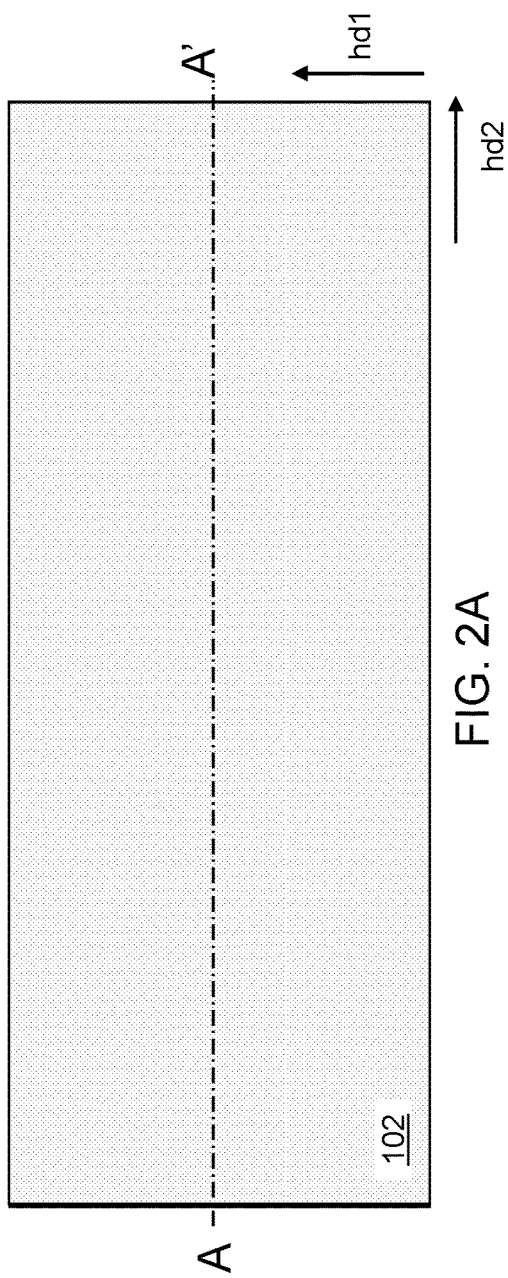
FIG. 2A is a plan view of an intermediate structure of a transistor after the deposition of a first dielectric layer over a substrate according to various embodiments of the present disclosure.
Figure 2B:
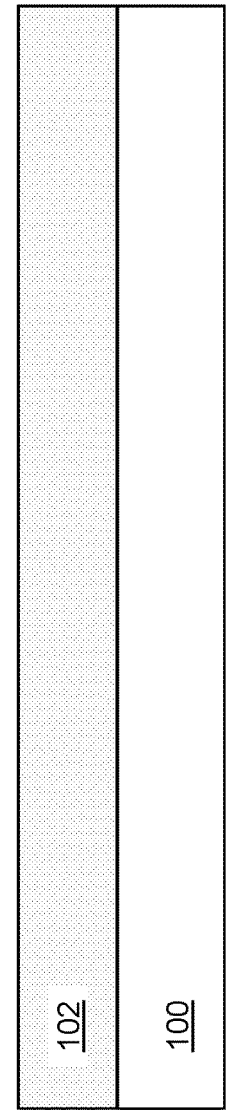
FIG. 2B is a vertical cross-sectional view taken along line A-A' of FIG. 2A according to a various embodiments of the present disclosure.

FIG. 2A is a plan view of an intermediate structure of a transistor after the deposition of a first dielectric layer over a substrate according to various embodiments of the present disclosure. FIG. 2B is a vertical cross-sectional view taken along line A-A' of FIG. 2A according to a various embodiments of the present disclosure. With reference to FIGS. 2A and 2B, a first dielectric layer 102 may be deposited on a substrate 100. The substrate 100 may be any suitable substrate, such as a plastic, glass, or semiconductor substrate, and may include control elements formed during FEOL processes. In some embodiments, the substrate 100 may be an interconnect level dielectric (ILD) layer such as interconnect level dielectric (ILD) layer 33. In other embodiments, the substrate 100 may be a buffer layer formed on a semiconducting substrate (not shown) or an insulating layer in a back-end-of-the-line (BEOL) portion of an integrated semiconductor device. The first dielectric layer 102 may be an insulating or dielectric material such as a silicon oxide. The first dielectric layer 102 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. In other embodiments, the first dielectric layer 102 may be grown from the underlying silicon substrate layer.

FIG. 3A is a plan view of an intermediate structure of a transistor after the formation of a word line trench in the first dielectric layer according to various embodiments of the present disclosure. FIG. 3B is a vertical cross-sectional view taken along line A-A' of FIG. 3A according to a various embodiments of the present disclosure. With reference to FIGS. 3A and 3B, a photoresist layer 101 may be applied over the first dielectric layer 102. The photoresist layer 101 may be lithographically patterned to form a line and space pattern that includes photoresist material strips that extend along the first horizontal direction hd1. An anisotropic etch process may be performed to etch unmasked portions of the first dielectric layer 102. A word line trench 103 extending along the first horizontal direction hd1 may be formed in areas that are not masked by the photoresist material strips. The anisotropic etch process may use any suitable etching process, such as a wet or dry etching process. The photoresist layer 101 may be subsequently removed, for example, by ashing.

Figure 4A:
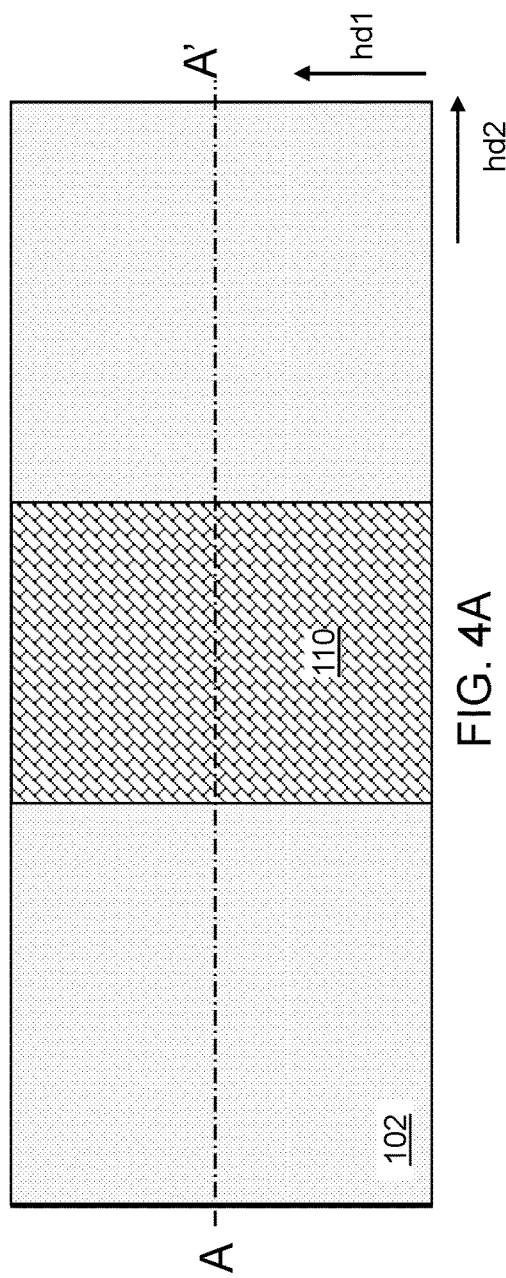
FIG. 4A is a plan view of an intermediate structure of a transistor after the deposition of a metallic fill material in the word line trench to form a word line according to various embodiments of the present disclosure.
Figure 4B:
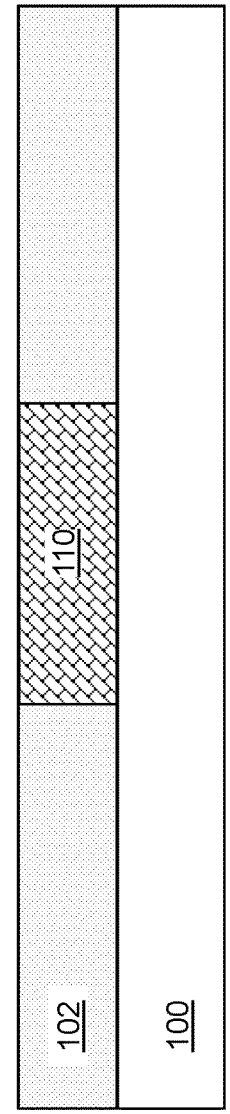
FIG. 4B is a vertical cross-sectional view taken along line A-A' of FIG. 4A according to a various embodiments of the present disclosure.

FIG. 4A is a plan view of an intermediate structure of a transistor after the deposition of a metallic fill material in the word line trench to form a word line according to various embodiments of the present disclosure. FIG. 4B is a vertical cross-sectional view taken along line A-A' of FIG. 4A according to a various embodiments of the present disclosure. With reference to FIGS. 4A and 4B, an electrically conductive metallic fill material may be deposited over the first dielectric layer 102 to full word line trench 103. A planarization process, such as CMP, may then be performed to planarize upper surfaces of the first dielectric layer 102 and the word lines 110, and remove any excess electrically conductive metallic fill material from the upper surface of the first dielectric layer 102 and word line trench 103. The word lines 110 may be formed of any suitable electrically conductive metallic fill material, using any suitable deposition method as described herein. For example, the word lines 110 may be formed of copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive metallic fill material are within the contemplated scope of disclosure.

Figure 5A:
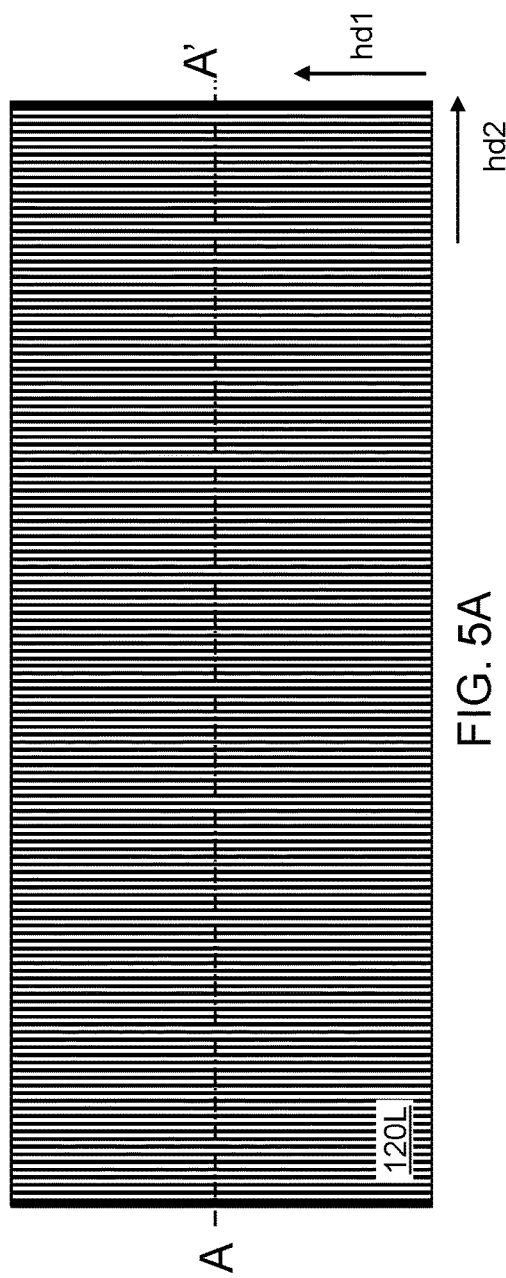
FIG. 5A is a plan view of an intermediate structure of a transistor after the deposition of a gate dielectric blanket layer and a semiconducting channel blanket layer material according to various embodiments of the present disclosure.
Figure 5B:
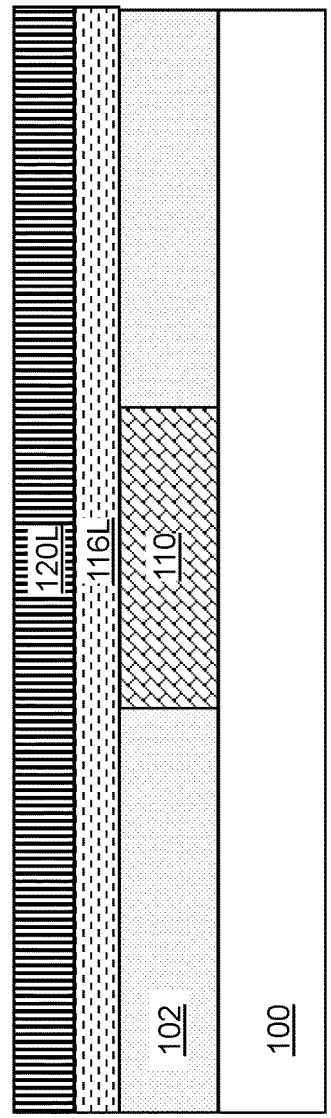
FIG. 5B is a vertical cross-sectional view taken along line A-A' of FIG. 5A according to a various embodiments of the present disclosure.

FIG. 5A is a plan view of an intermediate structure of a transistor after the deposition of a gate dielectric blanket layer and a semiconducting channel blanket layer material according to various embodiments of the present disclosure. FIG. 5B is a vertical cross-sectional view taken along line A-A' of FIG. 5A according to a various embodiments of the present disclosure. With reference to FIGS. 5A and 5B, a gate dielectric material layer blanket 116L and a semiconducting channel material blanket layer 120L may be deposited on the first dielectric layer 102, covering the word lines 110. In particular, the gate dielectric blanket layer 116L may be formed of any suitable material, such as $SiO_2$, $HfO_2$, $Al_2O_3$, $Ta_2O_5$, $ZrO_2$, $TiO_2$ or combinations thereof. The gate dielectric blanket layer may be deposited using any of the suitable deposition techniques discussed above with respect to the first dielectric layer 102. A thickness of the continuous gate dielectric material layer blanket 116L may be in a range of about 5 angstroms to about 500 angstroms.

The semiconducting channel material blanket layer 120L may be deposited using any suitable deposition process, as described herein. The semiconducting channel material blanket 120L may be a semiconductor material. For example, the semiconducting channel material blanket 120L may comprise polysilicon, amorphous silicon, or a metal oxide semiconducting material, such as Indium-Gallium-Zinc-Oxide (IGZO), indium tin oxide (ITO), InWO, InZnO, InSnO, GaOx, $InO_x$, or the like. However, other suitable semiconductor materials are within the contemplated scope of the present disclosure. A thickness of the continuous channel layer 120L may be in a range of about 5 angstroms to about 500 angstroms. The continuous gate dielectric layer 116L and the continuous channel layer 120L may be made by any suitable method such as chemical vapor deposition (CVD), plasma enhance chemical vapor deposition (PECVD), or atomic layer deposition.

Figure 6A:
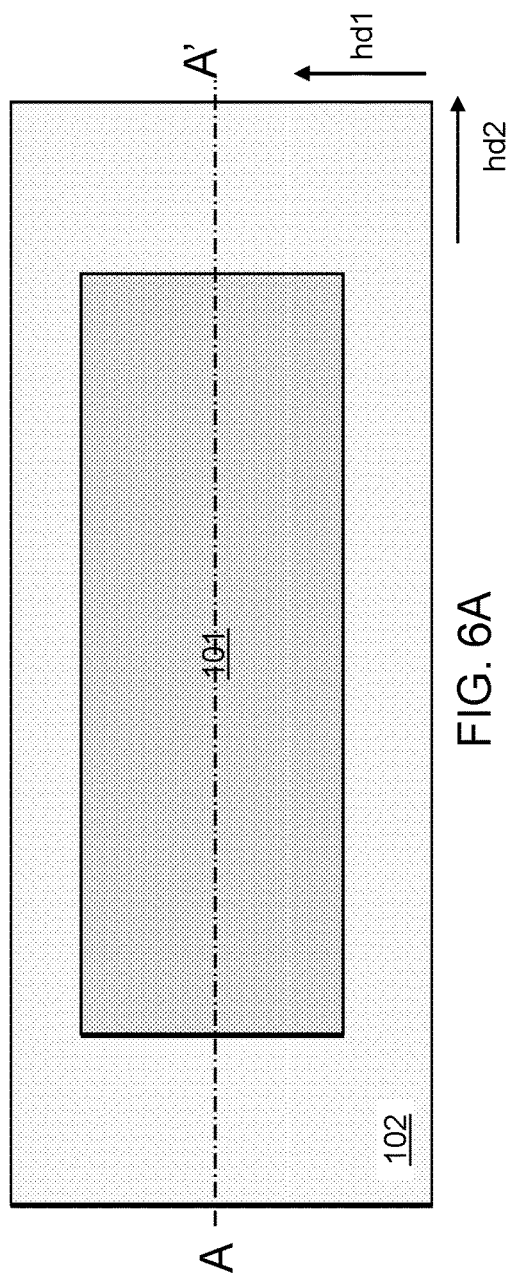
FIG. 6A is a plan view of an intermediate structure of a transistor after the patterning of gate dielectric blanket layer and a semiconducting channel blanket layer according to various embodiments of the present disclosure.
Figure 6B:
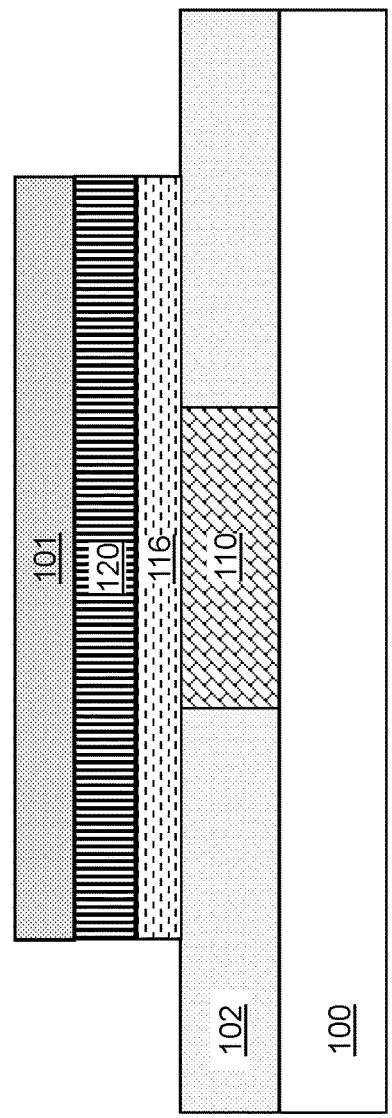
FIG. 6B is a vertical cross-sectional view taken along line A-A' of FIG. 6A according to a various embodiments of the present disclosure.

FIG. 6A is a plan view of an intermediate structure of a transistor after the patterning of gate dielectric blanket layer and a semiconducting channel blanket layer according to various embodiments of the present disclosure. FIG. 6B is a vertical cross-sectional view taken along line A-A' of FIG. 6A according to a various embodiments of the present disclosure. Referring to FIGS. 6A and 6B, the semiconducting channel material blanket layer 120L may be patterned to form a semiconductor channel 120. In particular, a photoresist layer 101 may be applied over the semiconducting channel material blanket layer 120L. The photoresist layer 101 may be lithographically patterned to form a line pattern that includes photoresist material strips that extend along the second horizontal direction hd2. An anisotropic etch process may be performed to etch unmasked portions of the semiconducting channel material blanket layer 120L. A semiconductor channel 120 and gate dielectric 116 may be formed, wherein both extend along the second horizontal direction hd2 in areas that are not masked by the photoresist material strips. The anisotropic etch process may use any suitable etching process, such as a wet or dry etching process. The photoresist layer 101 may be subsequently removed, for example, by ashing.

As shown in FIGS. 6A and 6B, the gate dielectric layer 116 may also be etched. However, in other embodiments, the semiconducting channel material blanket layer 120L may be etched selective to the gate dielectric layer (e.g., the gate dielectric layer 116L may remain substantially un-etched).

Figure 7A:
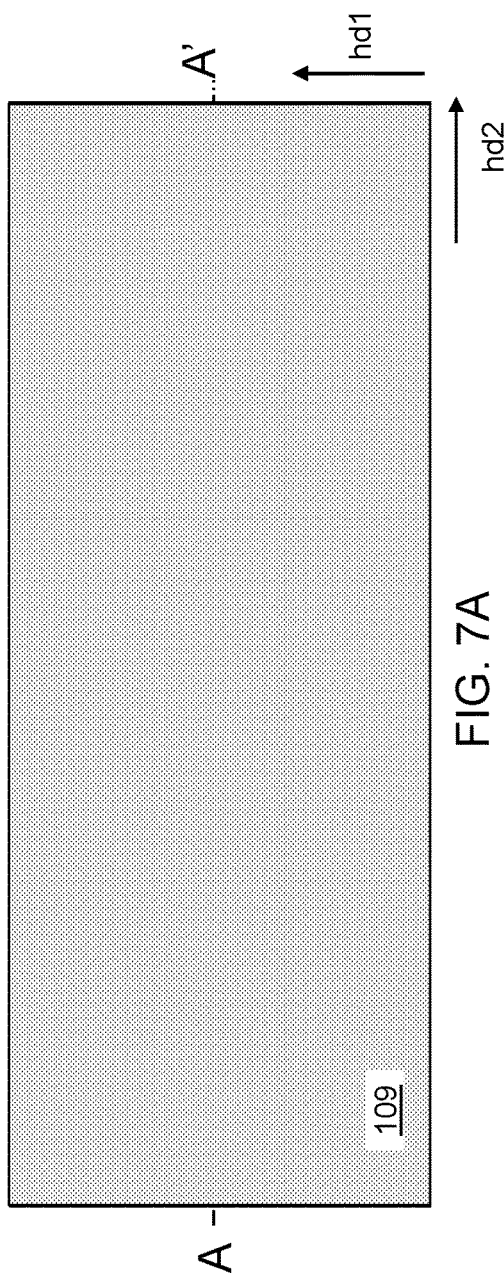
FIG. 7A is a plan view of an intermediate structure of a transistor after forming an interlayer dielectric layer (ILD) over the intermediate structure illustrated in FIGS. 6A and 6B.
Figure 7B:
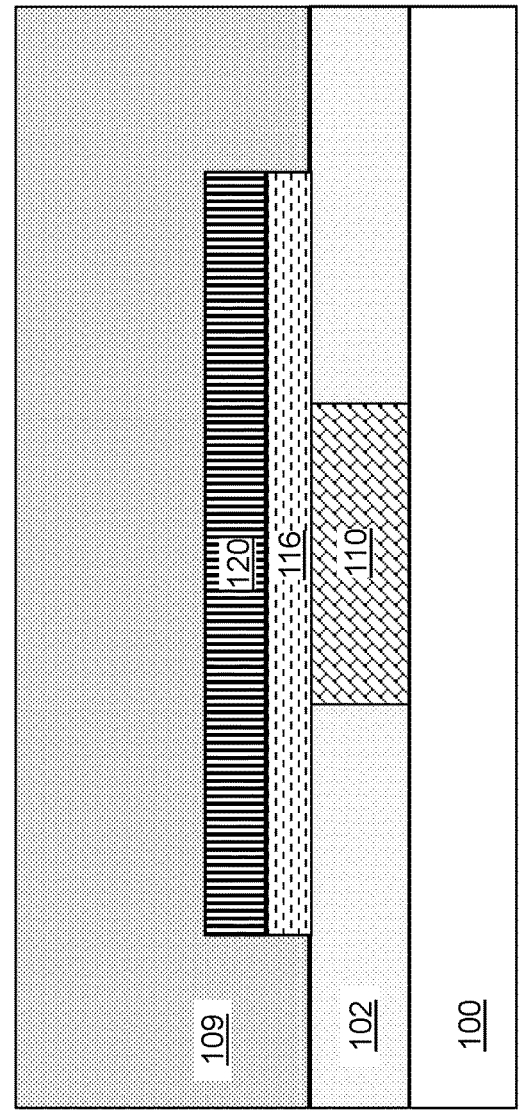
FIG. 7B is a vertical cross-sectional view taken along line A-A' of FIG. 7A according to a various embodiments of the present disclosure.

Referring to FIGS. 7A and 7B, an ILD layer 109 may be formed over the intermediate structure illustrated in FIGS. 7A and 7B. The ILD layer 109 may be made of silicon dioxide, fluorinated silicon glass (FSG), borosilicate glass (BSG) and/or other insulating materials.

Figure 8A:
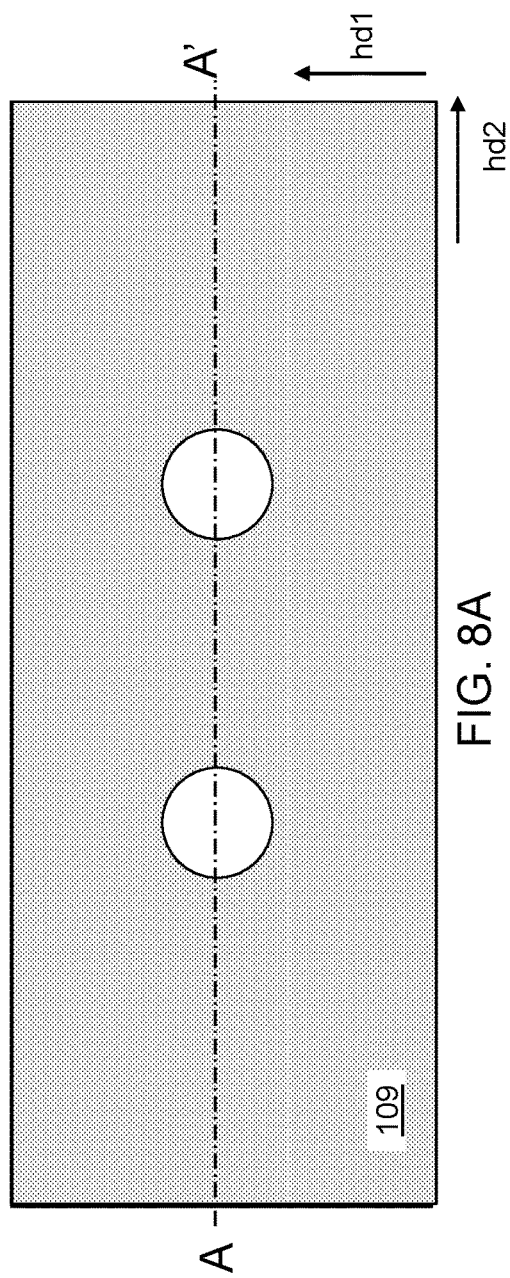
FIG. 8A is a plan view of an intermediate structure of a transistor after forming contact via holes in the interlayer dielectric layer (ILD).
Figure 8B:
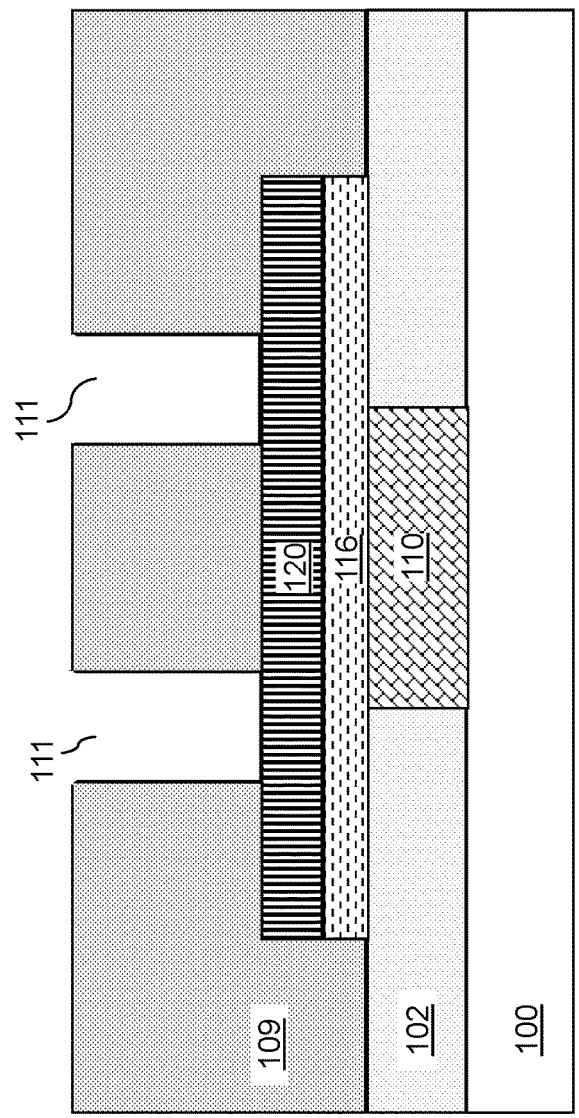
FIG. 8B is a vertical cross-sectional view taken along line A-A' of FIG. 8A according to a various embodiments of the present disclosure.

Referring to FIGS. 8A and 8B, after forming the ILD layer 109, contact via holes 111 may be formed in the ILD layer 109. For example, a photoresist layer (not shown) may be applied over the ILD layer 109. The photoresist layer may be lithographically patterned to form openings for the contact via holes 111. An anisotropic etch process may be performed to etch unmasked portions of the ILD layer 109. Contact via holes may be formed in areas that are not masked by the photoresist material strips. The contact via holes may be spaced apart in a second horizontal direction hd2. The contact via holes 111 extend to the patterned channel layer 120 and thereby exposing portions of the patterned channel layer 120. The anisotropic etch process may use any suitable etching process, such as a wet or dry etching process. The photoresist layer may be subsequently removed, for example, by ashing.

Figure 9A:
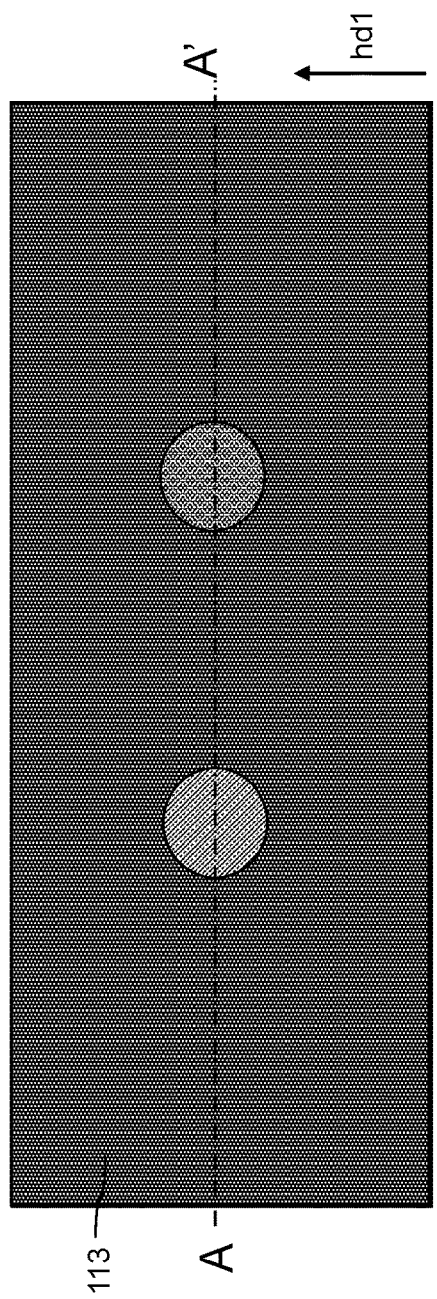
FIG. 9A is a plan view of an intermediate structure of a transistor after depositing a metal layer over the intermediate structure illustrated in FIGS. 8A and 8B according to various embodiments of the present disclosure.
Figure 9B:
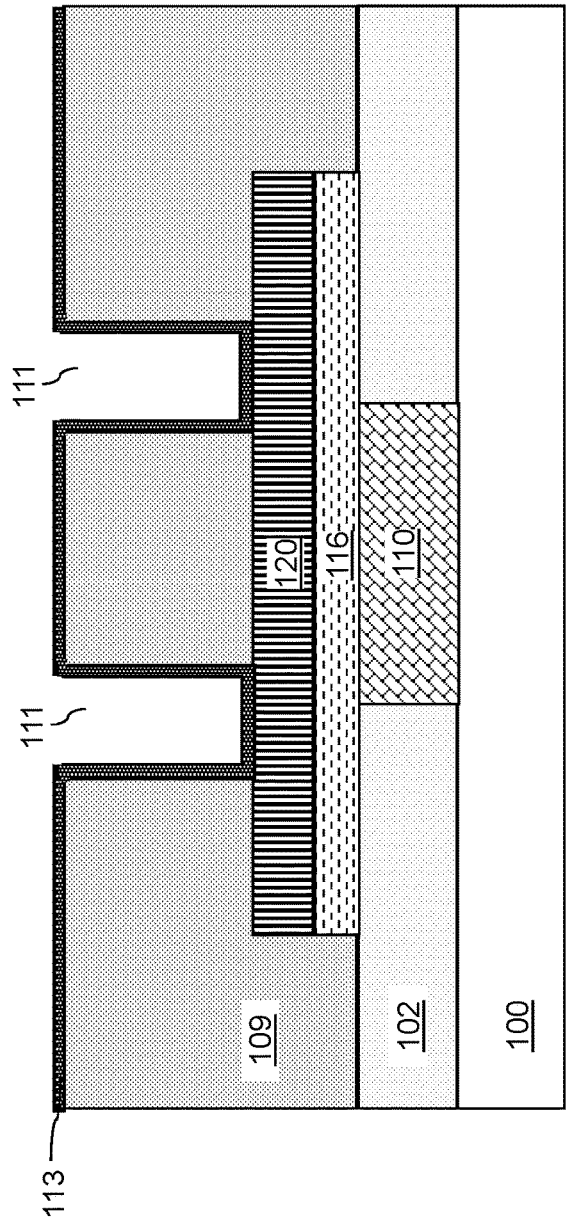
FIG. 9B is a vertical cross-sectional view taken along line A-A' of FIG. 9A according to a various embodiments of the present disclosure.

Referring to FIGS. 9A and 9B, a metal layer 113 may be conformally deposited over the intermediate structure illustrated in FIGS. 8A and 8B. The metal layer 113 may be made of any material that may react with the patterned channel layer 120 and the ILD layer 109. In various embodiments, the metal layer comprises aluminum. The metal layer 113 may be deposited by CVD, PECVE, ALD or any other suitable process. The metal layer 113 may have a thickness of between 1 nm and 20 nm, although lesser or greater thicknesses may be used.

Referring to FIGS. 10A and 10B, the intermediate structure illustrated in FIGS. 9A and 9B may undergo an anneal process in the presence of oxygen wherein the metal layer 113 may be heated to react with the patterned channel layer 120 and oxygen in the ambient atmosphere. In an embodiment, the patterned channel layer 120 comprises IGZO and the metal layer 113 comprises Al. In this embodiment, the portion of the patterned channel layer 120 in contact with the metal layer 113 reacts with the metal layer 113 to form a self-aligned active regions 117 comprising $AlO_x$—$InO_x$—$ZnO_x$ over the patterned channel layer 120. Between the pair of self-aligned active regions 117 is a channel region 120C. The reaction may result in the formation of oxygen vacancies in the self-aligned active region 117 which may result in the self-aligned active region 117 becoming an $n^+$ type doped region. Additionally, the metal layer 113 which is not directly contact with channel layer may react with the annealing oxygen gas to form a self-aligned passivation protection layer 115 of aluminum oxide layer ($Al_2O_3$) on the sidewalls of contact via holes 111. The self-aligned passivation protection layer 115 lines the contact via holes 111 and is therefore self-aligned with the active regions 117. Additionally, as illustrated in FIGS. 10A and 10B, the self-aligned passivation protection layer 115 may also protect the top surface of the ILD layer 109.

Figure 11A:
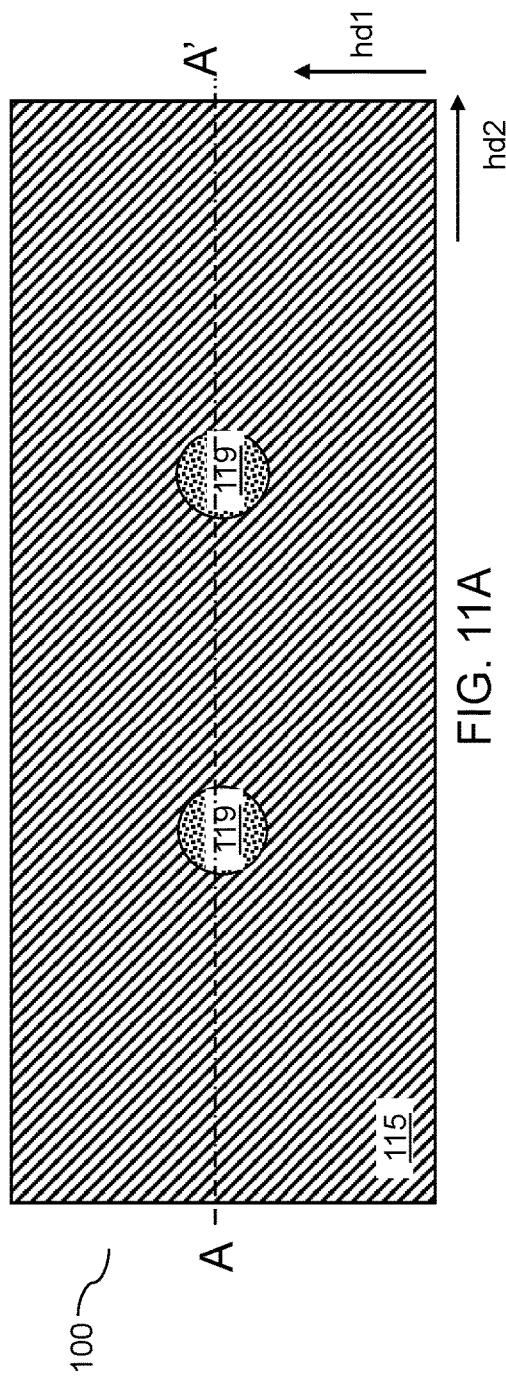
FIG. 11A is a plan view of an intermediate structure of a transistor after forming contact structures in the contact via holes according to an embodiment of the present disclosure.
Figure 11B:
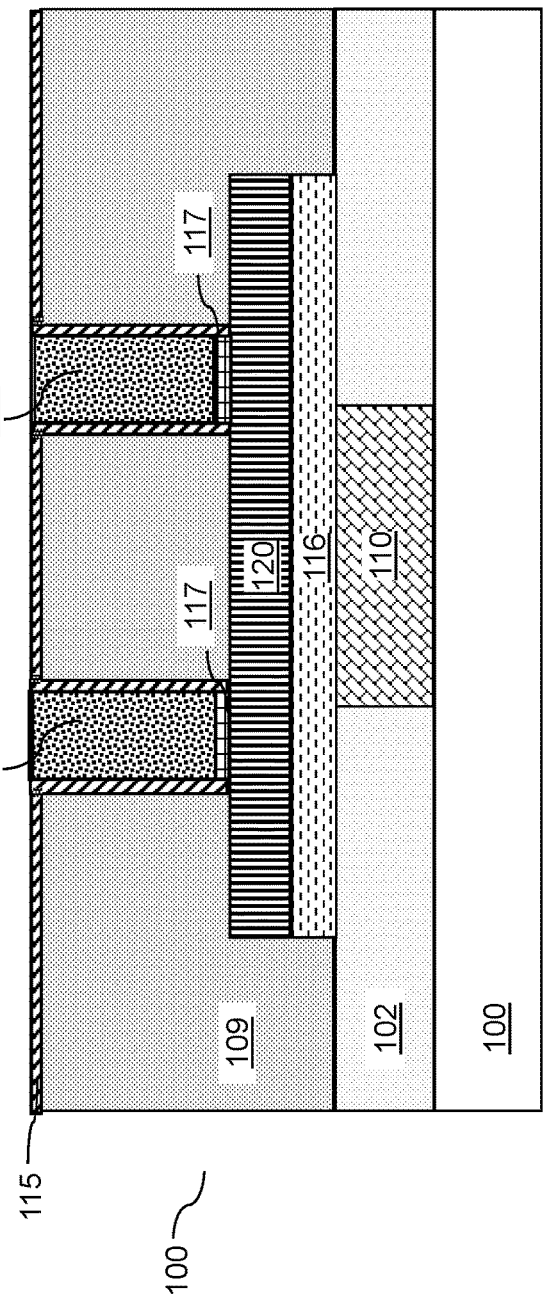
FIG. 11B is a vertical cross-sectional view taken along line A-A' of FIG. 11A according to a various embodiments of the present disclosure.

Referring to FIGS. 11A and 11B, contact via structures 119 may be formed by filling the remaining space in the contact via holes 111 with a conductive material. The contact structures 119 may be electrically connected to the active regions 117. Example conductive materials include TiN, TaN, and/or WN, W, Cu, Co, Mo, Ru, other elemental metals, or an alloy or a combination thereof. In this manner, an embodiment transistor 100 may be completed. As illustrated, the transistor 100 is a bottom gate field effect transistor. Optionally, a planarization step may be performed after forming the contact via structures 119. The planarization step may be performed, for example, by chemical-mechanical polishing such that any excess conductive material of the contact via structures 119 may be removed. In addition a top surface of ILD layer 109 and top surfaces of contact via structures 119 may be co-planar.

Figure 12:
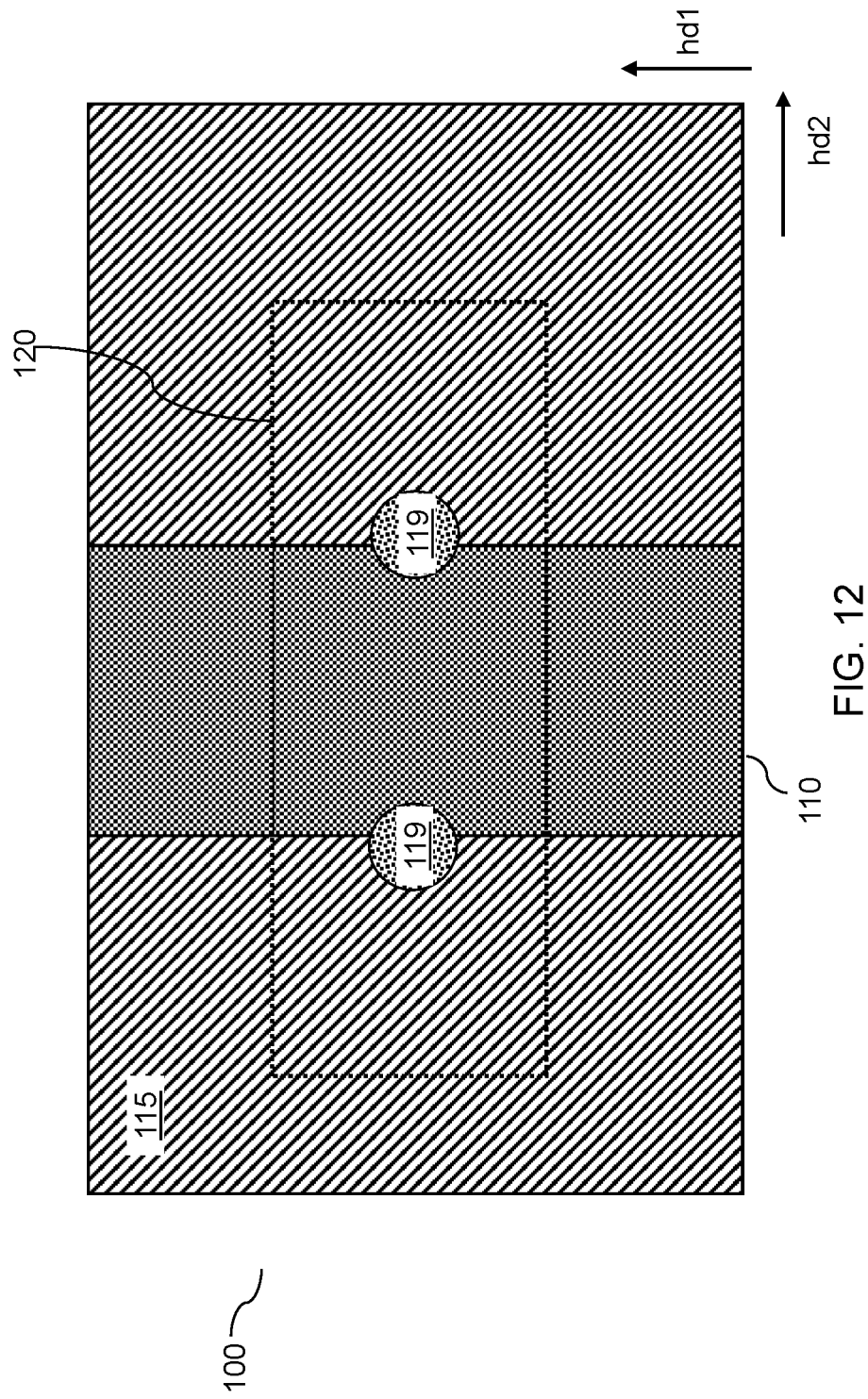
FIG. 12 is a top view illustrating the transistor of FIGS. 11A and 11B according to an embodiment of the present disclosure.

FIG. 12 is a top view illustrating the transistor 100 illustrated in FIGS. 11A and 11B. The ILD layer 109 is not illustrated so that details of the transistor 100 may be seen. Outlines of various structures at different levels within the transistor 100 are illustrated. As illustrated, the self-aligned passivation protection layer 115 surrounds the contact via structure 119. Further, the patterned channel layer 120 extends laterally in a second horizontal direction hd2 beyond the contact via structures 119 with the active region 117 in the patterned channel layer 120 located beneath contact via structures 119. The contact via structures 119 and underlying active regions 117 may be separated along a second horizontal direction hd2. The gate electrode/word line 110 may extend along a first horizontal direction hd1 that is perpendicular to the second horizontal direction hd2.

Figure 13A:
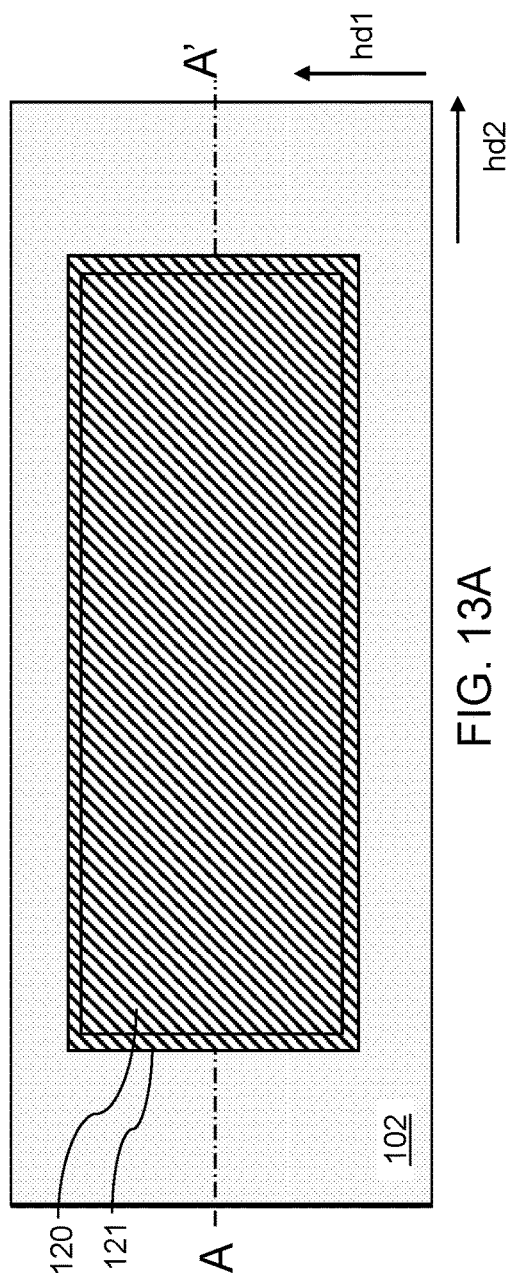
FIG. 13A is a plan view of an intermediate structure of a transistor after forming a lower protection layer over a patterned gate dielectric layer and a patterned channel layer according to an alternative embodiment of the present disclosure.

FIGS. 13A-17B illustrate an alternative embodiment transistor and method of making. Referring to FIGS. 13A and 13B, a lower protection layer 121 may be formed over the intermediate structure illustrated in FIGS. 6A and 6B after the photoresist layer 101 may be removed. In FIG. 13A, the outline of the underlying patterned channel 120 and underlying gate dielectric layer 116 is illustrated. In various embodiments, the lower protection layer 121 may be conformally deposited over the patterned channel region 120. The lower protection layer 121 made of the same material as the self-aligned passivation protection layer 115. That is, the lower protection layer 121 may be made of $Al_2O_3$. However, the lower protection layer 121 may be made of any suitable material.

Figure 13B:
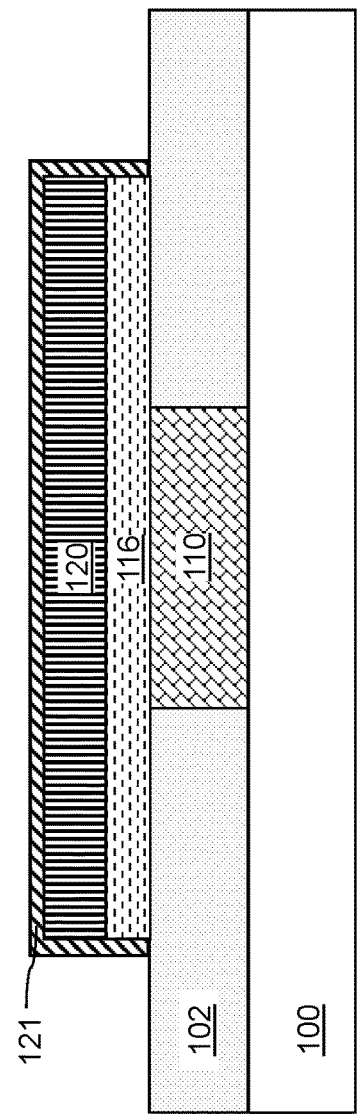
FIG. 13B is a vertical cross-sectional view taken along line A-A' of FIG. 13A according to an alternative embodiment of the present disclosure.
Figure 14A:
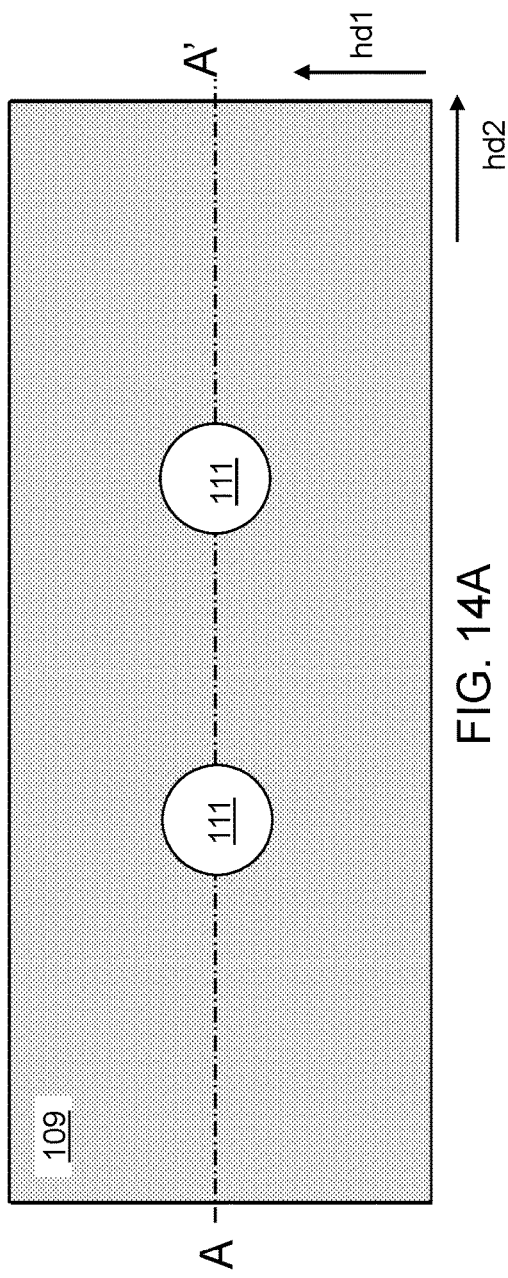
FIG. 14A is a plan view of an intermediate structure of a transistor after forming contact via holes in the interlayer dielectric layer (ILD) according to an alternative embodiment of the present disclosure.
Figure 14B:
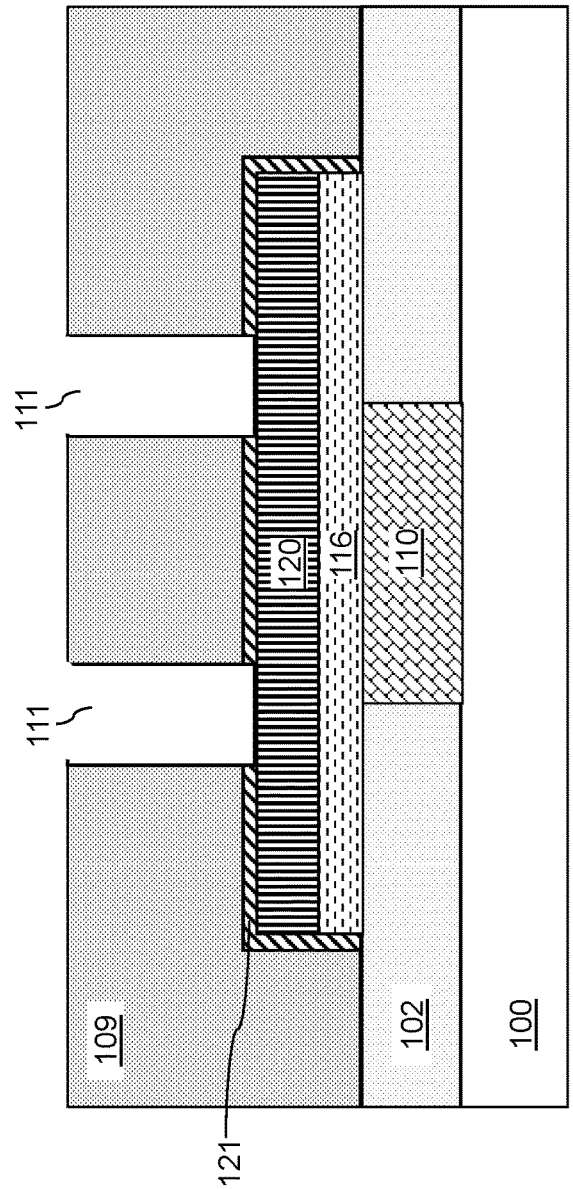
FIG. 14B is a vertical cross-sectional view taken along line A-A' of FIG. 14A according to an alternative embodiment of the present disclosure.

Referring to FIGS. 14A and 14B, an ILD layer 109 may be deposited over the intermediate structure illustrated in FIGS. 13A and 13B. Then contact via holes 111 may be formed in the ILD layer 109. In various embodiments, the contact via holes 111 extend through the lower protection layer 121 to the top surface of the patterned channel layer 120C. The contact via holes 111 may be formed in a single etching step or in a series of successive etching steps. Further, the contact via holes 111 may be formed by wet etching, dry etching or a combination thereof.

Figure 15A:
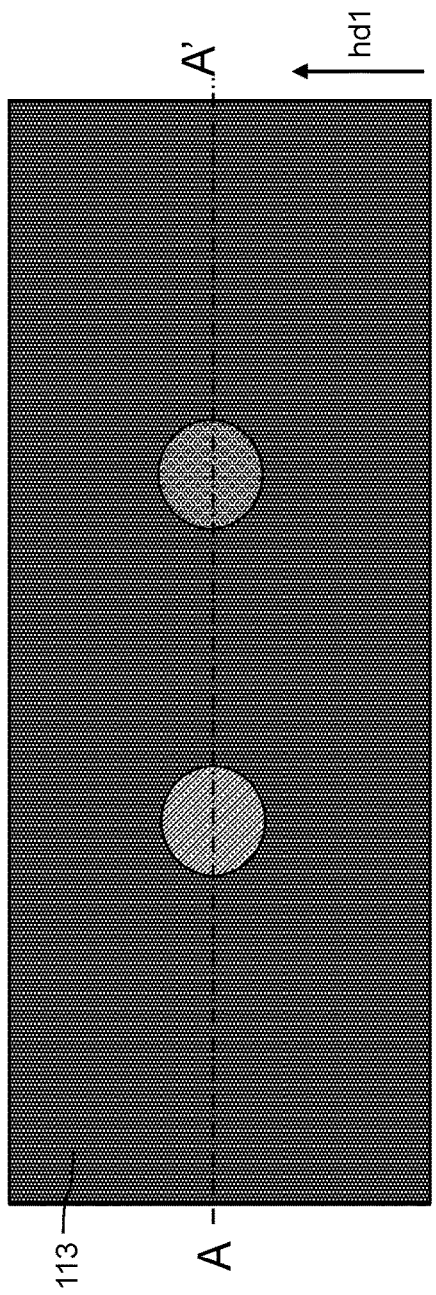
FIG. 15A is a plan view of an intermediate structure of a transistor after depositing a metal layer over the intermediate structure illustrated in FIGS. 14A and 14B according to an alternative embodiment of the present disclosure.
Figure 15B:
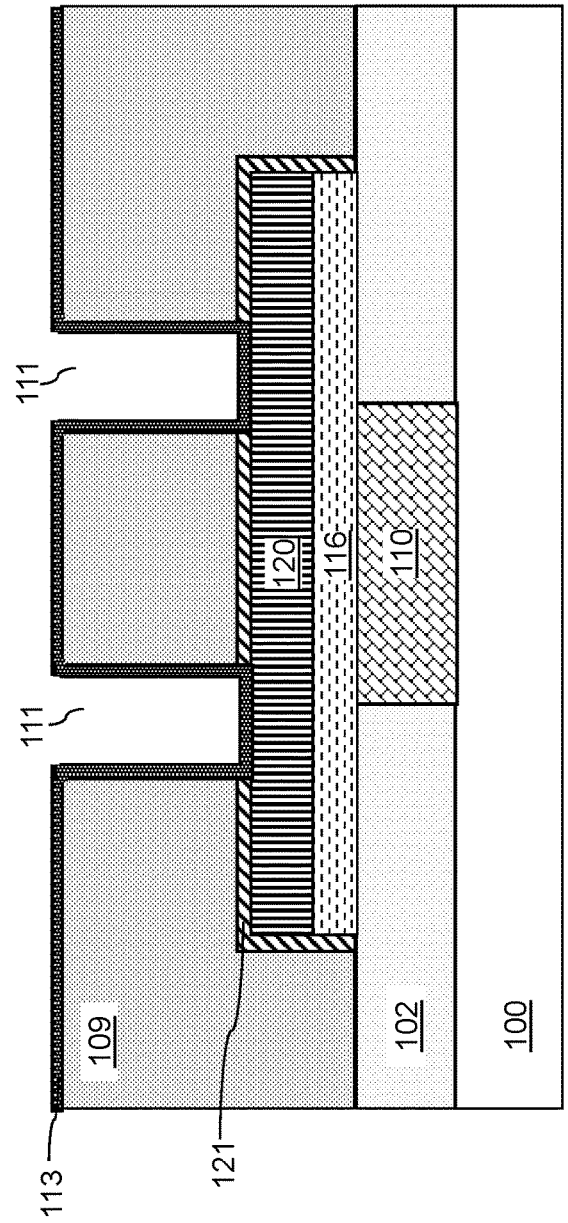
FIG. 15B is a vertical cross-sectional view taken along line A-A' of FIG. 15A according to an alternative embodiment of the present disclosure.

Referring to FIGS. 15A and 15B, a metal layer 113 may be conformally deposited over the intermediate structure illustrated in FIGS. 14A and 14B. As in the embodiment above illustrated in FIGS. 9A and 9B, the metal layer 113 may be made of any suitable metal. In various embodiment, the metal layer 113 may comprise Al or alloys thereof.

Figure 16A:
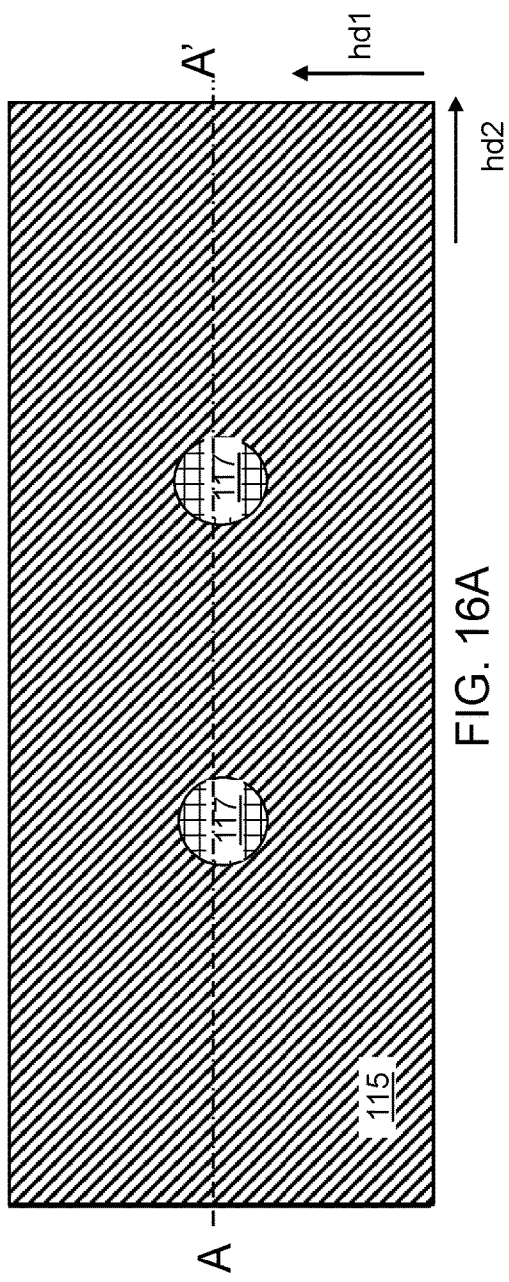
FIG. 16A is a plan view of an intermediate structure of a transistor after heating the intermediate structure illustrated in FIGS. 15A and 15B to react the metal with the IDL layer and the channel layer according to an alternative embodiment of the present disclosure.
Figure 16B:
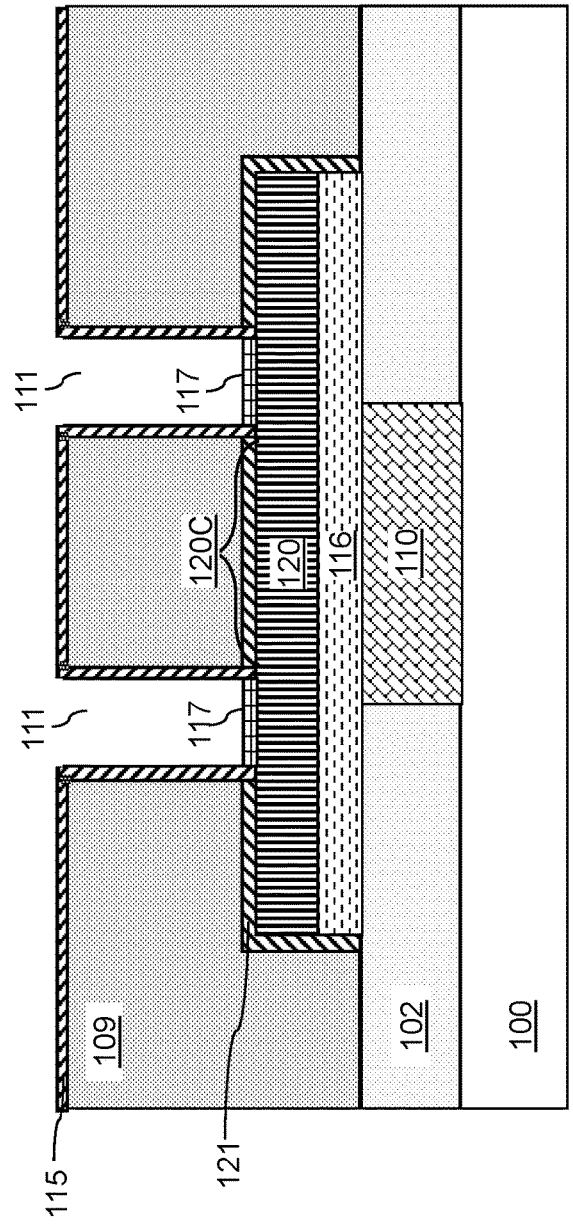
FIG. 16B is a vertical cross-sectional view taken along line A-A' of FIG. 16A according to an alternative embodiment of the present disclosure.

Referring to FIGS. 16A and 16B, the intermediate structure illustrated in FIGS. 15A and 15B may undergo an anneal process in an oxygen atmosphere wherein the metal layer 113 may be heated to react with the patterned channel layer 120 and oxygen in the ambient atmosphere. In an embodiment, the patterned channel layer 120 comprises IGZO and the metal layer 113 comprises Al. In this embodiment, the portion of the patterned channel layer 120 in contact with the metal layer 113 reacts with the metal layer 113 to form a self-aligned active regions 117 comprising $AlO_x$—$InO_x$—$ZnO_x$ in the patterned channel layer 120. Between the pair of active regions 117 is a channel region 120C. The reaction may result in the formation of oxygen vacancies in the self-aligned active region 117 which may result in the self-aligned active region 117 becoming an $n^+$ type doped region. Additionally, the metal layer 113 which is not directly contact with channel layer may react with the annealing oxygen gas to form a self-aligned passivation protection layer 115 of aluminum oxide layer ($Al_2O_3$) on the sidewalls of contact via holes 111. The self-aligned passivation protection layer 115 lines the contact via holes 111 and is therefore self-aligned with the active regions 117.

Additionally, as illustrated in FIGS. 16A and 16B, the self-aligned passivation protection layer 115 may also protect the top surface of the ILD layer 109.

Figure 17A:
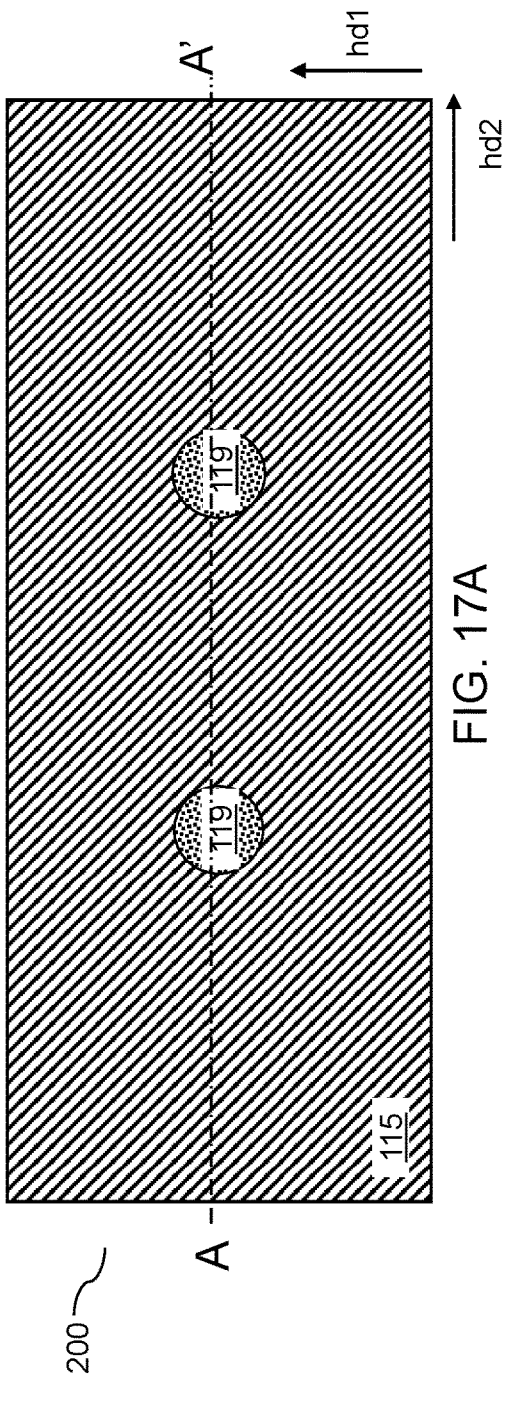
FIG. 17A is a plan view of an intermediate structure of a transistor after forming contact structures in the contact via holes according to an alternative embodiment of the present disclosure.
Figure 17B:
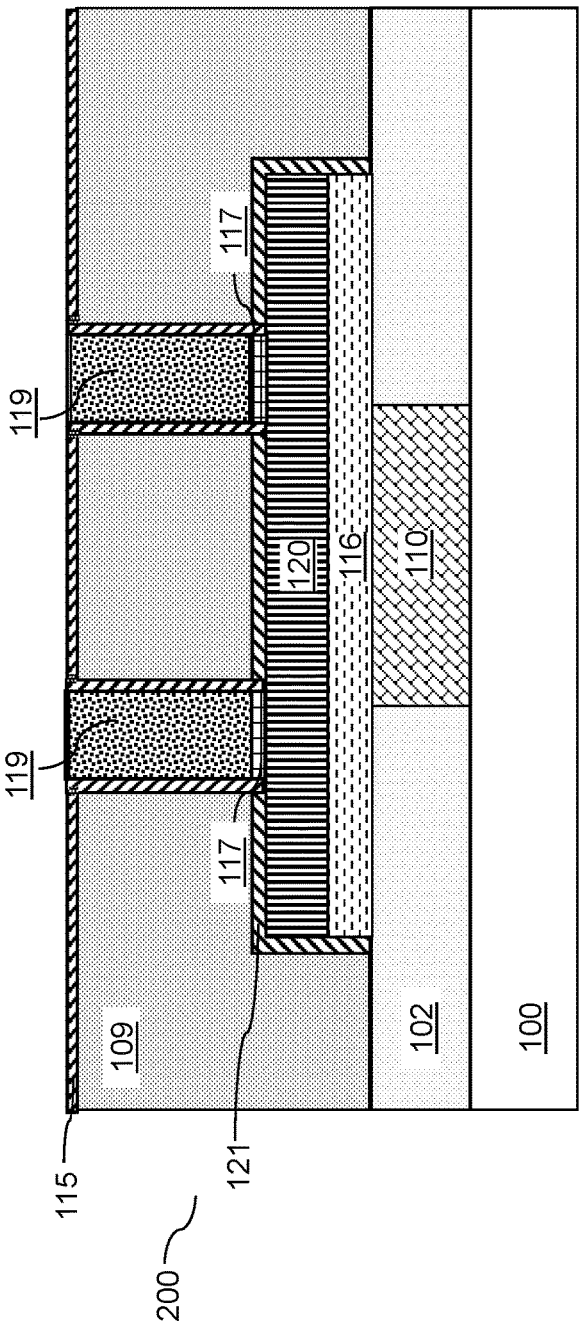
FIG. 17B is a vertical cross-sectional view taken along line A-A' of FIG. 17A according to an alternative embodiment of the present disclosure.

Referring to FIGS. 17A and 17B, contact via structures 119 may be formed by filling the remaining space in the contact via holes 111 with a conductive material. The contact via structures 119 may be electrically connected to the active regions 117. Example conductive materials include TiN, TaN, and/or WN, W, Cu, Co, Mo, Ru, other elemental metals, or an alloy or a combination thereof. In this manner, an embodiment transistor 200 may be completed. As illustrated, the transistor 200 is a bottom gate field effect transistor. Optionally, a planarization step may be performed after forming the contact via structures 119. The planarization step may be performed, for example, by chemical-mechanical polishing such that any excess conductive material of the contact via structures 119 may be removed. In addition a top surface of ILD layer 109 and top surfaces of contact via structures 119 may be co-planar. The result is a transistor 200 having a self-aligned active region 117 over portions of the patterned channel layer 120, a lower protection layer 121 over the remaining portions of the patterned channel layer 120 and a self-aligned passivation protection layer 115 lining the contact via structures 119.

FIGS. 18-23 illustrate another embodiment transistor and method of making the same. Referring to FIG. 18, contact via structures 119 may be formed on the surface of an insulating layer 102, such as a buffer layer. The contact via structures 119 may be formed by first depositing a continuous layer of conductive material. Next, a metal layer 113 may be deposited over the continuous layer of conductive material. Next, a photoresist layer (not shown) may be deposited over the metal layer 113 and patterned. Portions of the metal layer 113 and the continuous layer of conductive material that are not masked by the photoresist layer may be removed, such as by wet etching or dry etching. The remaining structure may be referred to as an active region stack that include both the contact via structure 119 and metal layer 113. Thus, a pair of active region stacks may be formed.

Figure 19:
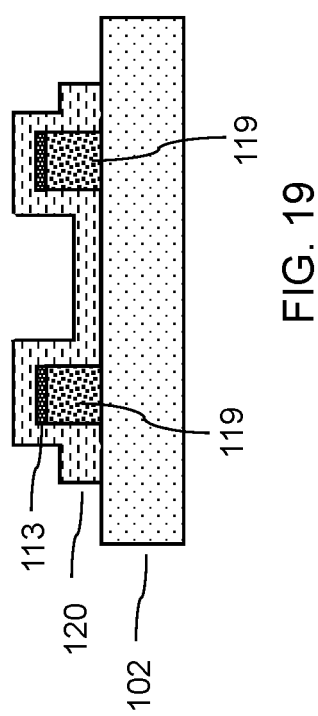
FIG. 19 is a vertical cross-sectional view illustrating forming a channel layer over the intermediate structure illustrated in FIG. 18 according to an embodiment of the present disclosure.

Referring to FIG. 19, a continuous channel layer 120L may be conformally deposited over the intermediate structure illustrated in FIG. 18 and patterned to form a patterned channel layer 120. Thus, the contact via structures 119 may be formed under the metal layer 113 and patterned channel layer 120. The continuous channel layer 120L may be patterned by first depositing a photoresist layer (not shown) over the continuous channel layer 120L and patterning. Unmasked portions of the continuous channel layer 120L may be removed to form the patterned channel layer 120. As illustrated in FIG. 19, the patterned the contact via structures 119 may be bordered on three sides by the patterned channel layer 120.

Figure 20:
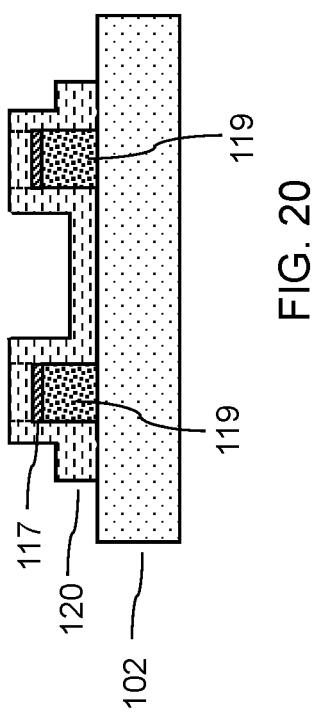
FIG. 20 is a vertical cross-sectional view illustrating heating the intermediate structure illustrated in FIG. 19 to react the metal layer with the channel layer an embodiment of the present disclosure.

Referring to FIG. 20, the intermediate structure illustrated in FIG. 19 may undergo an anneal process to heat the structure in order to react the metal layer 113 with a portion of the patterned channel layer 120 to form a self-aligned active region 117 in contact with a bottom surface of the patterned channel layer 120. As in the previous embodiments, an oxygen deficient region may form in the patterned channel layer 120 adjacent the self-aligned active region 117, resulting in an $n^+$ active region 117.

Figure 21:
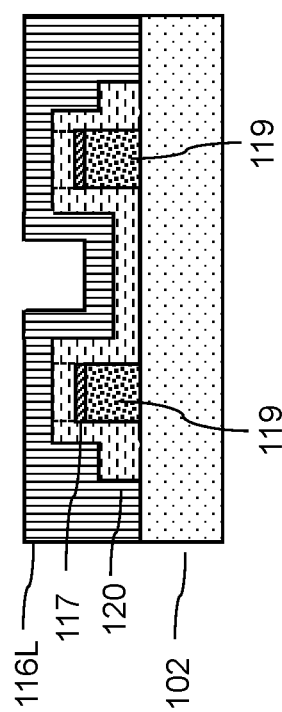
FIG. 21 is a vertical cross-sectional view illustrating forming a gate dielectric layer over the intermediate structure illustrated in FIG. 20 according to an embodiment of the present disclosure.

Referring to FIG. 21, a continuous gate dielectric layer 116L may be formed over the intermediate structure illustrated in FIG. 20. The continuous gate dielectric layer 116L may be formed by any suitable process, such as CVD, PECVD or ALD. The continuous gate dielectric layer 116L may be made of any suitable material, such as $SiO_2$, $HfO_2$, $Al_2O_3$, $Ta_2O_5$, $ZrO_2$, $TiO_2$ or combinations thereof.

Figure 22:
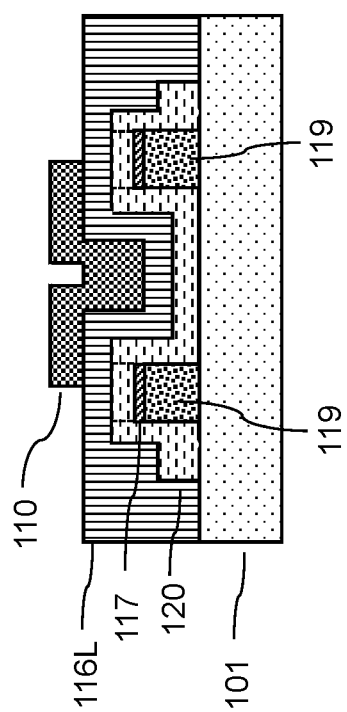
FIG. 22 is a vertical cross-sectional view illustrating forming a gate electrode/word line over the intermediate structure illustrated in FIG. 21 according to an embodiment of the present disclosure.

Referring to FIG. 22, a gate electrode/word line 110 may be formed on the intermediate structure illustrated in FIG. 21. The gate electrode/word line 110 may be formed by first depositing a photoresist layer (not shown) on the continuous gate dielectric layer 116L and patterning the photoresist layer. Gate material may then be deposited over patterned photoresist layer. Gate material on the exposed surface of the continuous gate dielectric layer 116L forms the gate electrode/word line 110. Excess gate material can be removed with the photoresist layer in a lift off process.

Figure 23:
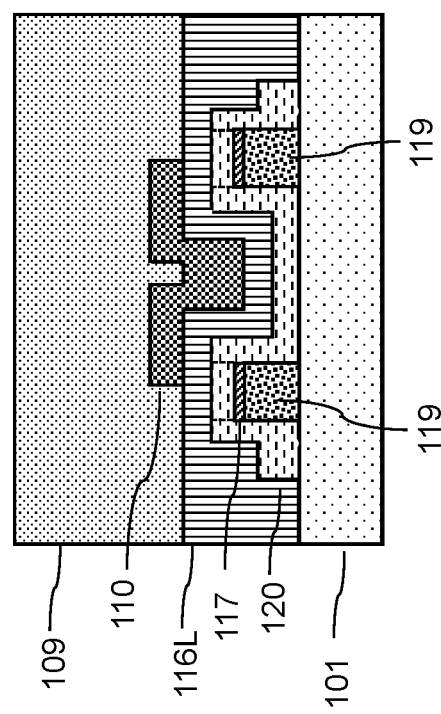
FIG. 23 is a vertical cross-sectional view illustrating forming a ILD layer over the intermediate structure illustrated in FIG. 22 according to an embodiment of the present disclosure.

Referring to FIG. 23, an ILD layer 109 can be formed over the intermediate structure illustrated in FIG. 22. After forming the ILD layer 109, the ILD layer 109 may be planarized, such as by chemical-mechanical polishing. In this manner, the embodiment transistor 300 may be completed. As illustrated, the transistor 300 is a top gate field effect transistor sometimes referred to as a front gated field effect transistor.

Figure 24:
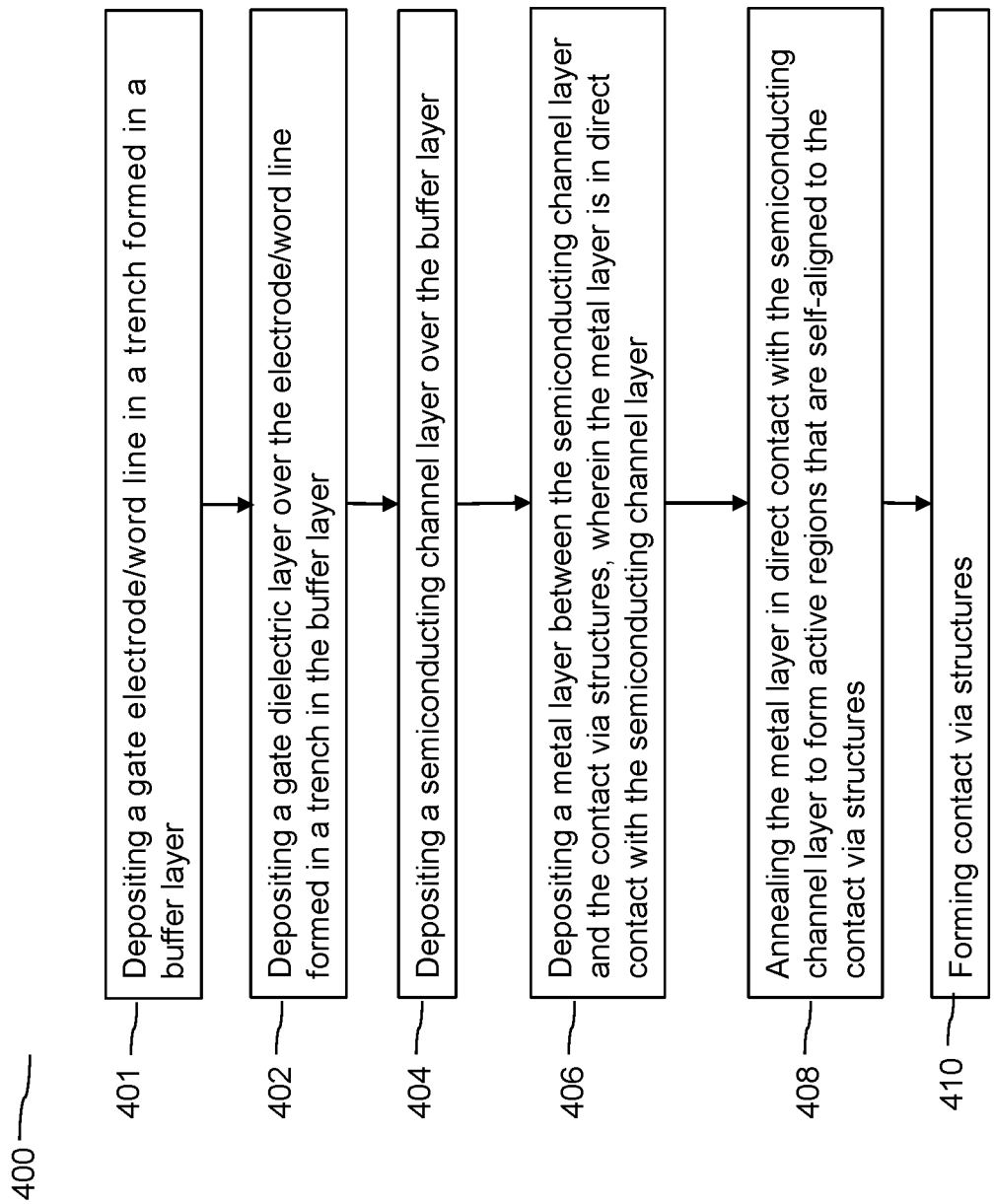
FIG. 24 is a flowchart that illustrates the general processing steps of the methods of the present disclosure.

FIG. 24 illustrates a general method 400 of making a field effect transistor 100 and 200. Referring to FIG. 24, the method 400 includes a step 401 of depositing a metal word line 110 in a trench formed in a buffer layer 102. The method may further include the step of 402 of depositing a gate dielectric layer 116 over the word line 110 and a buffer layer 102. Referring to step 404, the method also includes, depositing a semiconducting channel layer 120 over the buffer layer 102. Referring to step 406, the method includes depositing a metal layer 113 between the patterned semiconducting channel layer 120 and the contact via structures 119, wherein the metal layer 113 is in direct contact with the semiconducting channel layer 120. Referring to step 408, the method includes annealing the metal layer 113 in direct contact with the patterned semiconducting channel layer 120 to form active regions 117 that are self-aligned to the contact via structures 119. Referring to step 410, the method includes forming contact via structures 119. In some embodiments, the method may further include the operations of forming an interlayer dielectric layer 109 over the patterned semiconducting channel layer 120 and forming contact via holes 111 in the interlayer dielectric layer 109, the contact via holes 111 exposing portions of a top surface of the patterned semiconducting channel layer 120, wherein depositing the metal layer 113 between the patterned semiconducting channel layer 120 and the contact via structures 119 comprises conformally depositing the metal layer 113 over the interlayer dielectric layer 109, sidewalls of the contact via holes 111 and the exposed portions of the top surface of the patterned semiconducting channel layer 120; and wherein annealing the metal layer 113 in direct contact with the patterned semiconducting channel layer 120 also forms a self-aligned passivation protection layer 115 disposed on sidewalls of the contact via holes 111. In some embodiments, the method forming contact via structures 119 comprises depositing a conductive material in the contact via holes 111 after annealing the metal layer 113 in direct contact with the patterned semiconducting channel layer 120. In some embodiments, the method may include forming a lower protection layer 121 over the patterned semiconducting channel layer 120.

In some embodiments, the operation of annealing the metal layer 113 in direct contact with the patterned semiconducting channel layer 120 may be performed prior to depositing the gate dielectric layer 116.

Figure 25:
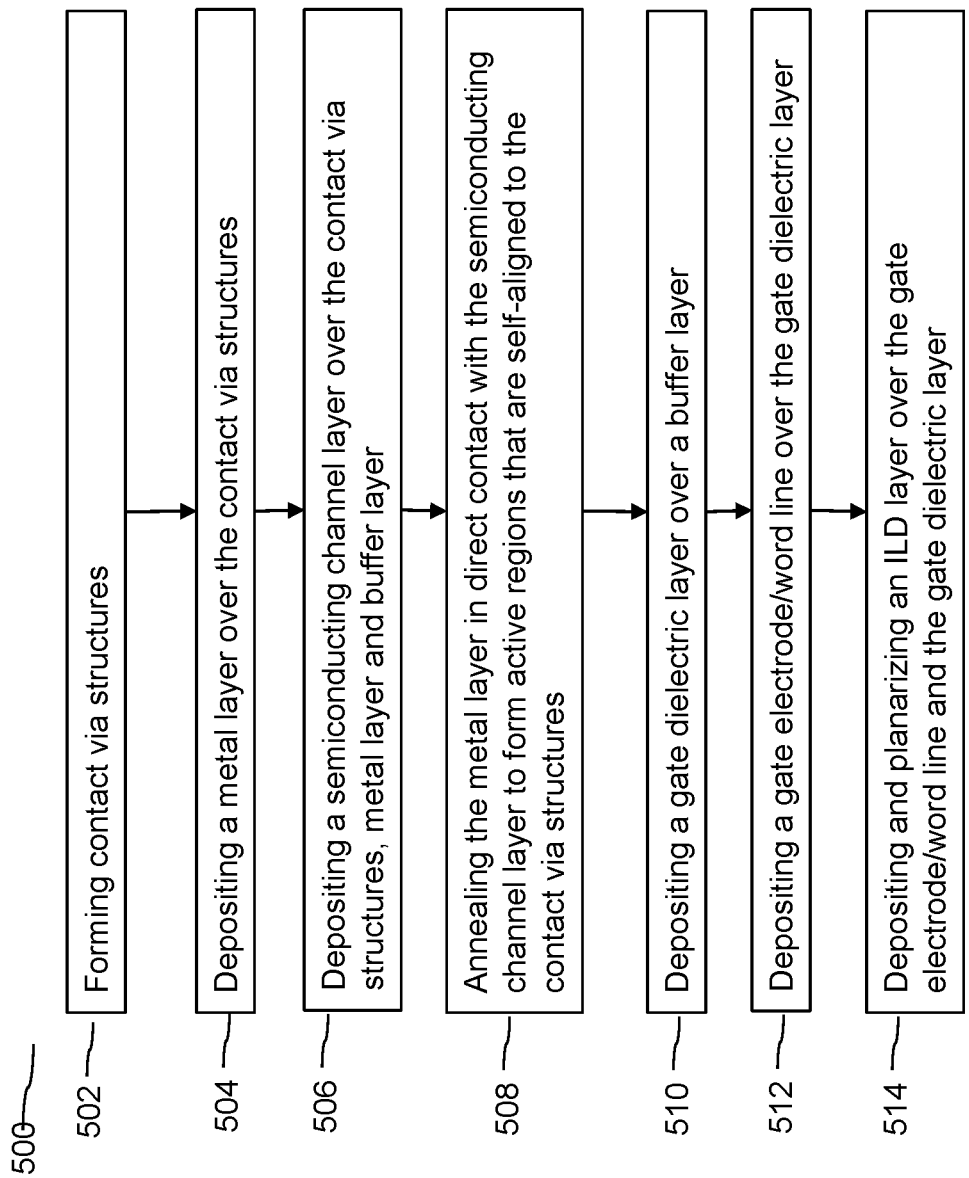
FIG. 25 is a flowchart that illustrates alternative processing steps of the methods of the present disclosure

FIG. 25 illustrates an alternative method 500 of making an alternative field effect transistor 300. Referring to FIG. 25, the method 500 includes a step 502 of depositing and forming contact via structures 119 over a buffer layer 102. Referring to step 504, the method also includes, depositing and forming metal layer 113 over the contact via structures 119. Referring to step 506, the method may include depositing and patterning a patterned semiconducting channel layer 120 over the contact via structures 119, metal layer 113 and buffer layer 102 such that the metal layer 113 is disposed between the patterned semiconducting channel layer 120 and the contact via structures 119. Moreover, the metal layer 113 may be in direct contact with the semiconducting channel layer 120. Referring to step 508, the method includes annealing the metal layer 113 in direct contact with the patterned semiconducting channel layer 120 to form active regions 117 that are self-aligned to the contact via structures 119. Referring to step 510, the method includes depositing a continuous gate dielectric layer 116L by any suitable process over the patterned semiconducting channel layer 120 and active regions 117. Referring to step 512, the method includes depositing a gate electrode/word line 110 on the continuous gate dielectric layer 116L. Referring to step 514, the method may include depositing and planarizing an ILD layer 109 over the gate electrode/word line 110 and the continuous gate dielectric layer 116L.

The present disclosure is directed to semiconductor devices, and specifically to field effect transistors 100, 200. Embodiments of the present disclosure are drawn to field effect transistors 100, 200 that include a pair of active regions 117 that may be formed over the channel layer 120. The field effect transistors 100, 200, 300 may include a channel region 120C formed in the channel layer 120L, wherein the channel region 120C is located between the pair of active regions 117. The field effect transistors 100, 200 may further include a pair of contact via structures 119 electrically connected to the pair active regions 117, wherein the active regions 117 are self-aligned to the contact via structures 119.

In embodiments of the present disclosure, the pair of active regions 117 may comprise self-aligned $n^+$ type doped regions. Other embodiment may further comprise a self-aligned passivation protection layer 115 disposed on sidewalls of the contact via structures 119. In some embodiments, the metal layer 113 may comprise a lower passivation protection layer 121 located between the channel layer 120 and an interlayer dielectric layer 109 that is formed over the channel layer 120, wherein the lower passivation protection layer 121 and the self-aligned passivation protection layer 115 comprise the same material. In an embodiment of the present disclosure, the pair of active regions 117 may be disposed on a top surface of the channel layer 120 and on a bottom surface of the contact via structures 119. In an embodiment of the present disclosure, the channel layer 120 comprises indium-gallium-zinc-oxide and the active regions 117 comprise $AlO_x$—$InO_x$—$ZnO_x$.

Other embodiments are drawn to a field effect transistor 300. The field effect transistor 300 may include a pair of contact via structures 119, a pair of active regions 117 electrically connected to the pair of contact via structures 119 forming a pair of active region stacks, wherein the pair of active regions 117 are self-aligned to the contact via structures 119. The field effect transistor 300 may also include a channel region 120C formed in the channel layer 120L, wherein the channel region 120C is located between the pair of active regions 117. The pair of active regions 117 may be disposed on a bottom surface of the channel layer 120. In another embodiment of the field effect transistor 300, the pair of active region stacks may be bordered on three sides by the channel layer 120. In another embodiment of the field effect transistor 300, the pair of active regions comprise self-aligned n⁺ type doped regions. In another embodiment of the field effect transistor 300, the pair of active regions 117 may be disposed on a top surface of the contact via structures 119 and on a bottom surface of the channel layer 120. In another embodiment of the field effect transistor 300, the channel layer 120 comprises indium-gallium-zinc-oxide and the pair of active regions 117 comprise $AlO_x$—$InO_x$—$ZnO_x$.

Other embodiments are drawn to a method 400 of making a field effect transistor 100, 200 including depositing a word line 110 in a trench 103 over a buffer layer 102. The method may further include depositing a gate dielectric layer 116 over a word line 110; depositing a semiconducting channel layer 120L over the gate dielectric layer 116; patterning the semiconducting channel layer 120L and the gate dielectric layer 116; depositing a metal layer 113 over the semiconducting channel layer 120, wherein the metal layer 113 is in direct contact with the semiconducting channel layer 120; and annealing the metal layer 113 in direct contact with the semiconducting channel layer 120; annealing the metal layer 113 in direct contact with the semiconducting channel layer 120 to form active regions 117; and forming contact via structures 119, wherein the active regions 117 are self-aligned to the contact via structures 119. Some embodiment methods may also include the operations of forming a lower protection layer 121 over the patterned semiconducting channel layer 120. In another embodiment method, the semiconducting channel layer 120 may include a metal oxide semiconducting material. In an embodiment method, the method may also include the steps of forming an interlayer dielectric layer 109 over the semiconducting channel layer 120; forming contact via holes 111 in the interlayer dielectric layer 109, the contact via holes 111 exposing portions of a top surface of the semiconducting channel layer 120; wherein depositing the metal layer 113 over the semiconducting channel layer 120 includes the operation of conformally depositing the metal layer 113 over the interlayer dielectric layer 109, sidewalls of the contact via holes 111 and exposed portions of the top surface of the semiconducting channel layer 120; and wherein annealing the metal layer 113 in direct contact with the semiconducting channel layer 120 also forms a self-aligned passivation protection layer 115 disposed on sidewalls of the contact via holes 111. In an embodiment method, the metal layer 113 may comprise aluminum and the step of annealing the metal layer 113 in direct contact with the semiconducting channel layer 120 may include the step of annealing in a presence of oxygen to form $AlO_x$—$InO_x$—$ZnO_x$ self-aligned active regions 117. In an embodiment method, the metal layer may comprise aluminum and the step of annealing the metal layer 113 in direct contact with the semiconducting channel layer 120 may include the step of annealing in a presence of oxygen to form an $Al_2O_3$ self-aligned protection layer 115 on the sidewalls of the contact via structures 119. In an embodiment method, annealing the metal layer 113 in direct contact with the semiconducting channel layer 120 to form active regions 117 that are self-aligned to the contact via structures 119 may include the step of forming self-aligned n⁺-type doped active regions 117 over the channel region 120C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor comprising:
   a pair of active regions over a channel layer;
   a channel region formed in the channel layer and located between the pair of active regions; and
   a pair of contact via structures electrically connected to the pair of active regions, wherein the contact via structure is formed in an interlayer dielectric layer that extends over the channel layer, and wherein the pair of active regions are self-aligned to the contact via structures.

2. The field effect transistor of claim 1, wherein the pair of active regions comprise self-aligned n⁺ type doped regions.

3. The field effect transistor of claim 1, wherein the pair of active regions are disposed on a top surface of the channel layer and on a bottom surface of the contact via structures.

4. The field effect transistor of claim 1, wherein the pair of contact via structures comprises conductive material chosen from TiN, TaN, WN, W, Cu, Co, Mo, Ru, or an alloy, or a combination thereof.

5. The field effect transistor of claim 1, wherein the channel layer comprises indium-gallium-zinc-oxide and the pair of active regions comprise $AlO_x$—$InO_x$—$ZnO_x$.

6. The field effect transistor of claim 1, wherein the interlayer dielectric layer comprises a bottom surface that is co-planar with a gate dielectric layer disposed under the channel layer and the top surface of the passivation layer is co-planar with top surfaces of the pair of contact via structures.

7. The field effect transistor of claim 1, further comprising a passivation layer extending over a top surface of the interlayer dielectric layer and a lower passivation protection layer located between the channel layer and the interlayer dielectric layer, wherein the lower passivation protection layer and the passivation protection layer comprise the same material.

8. The field effect transistor of claim 7, wherein the pair of contact via structures extend through the lower passivation protection layer to a top surface of the channel layer.

9. An interconnect-level structure for a field effect transistor comprising:
   a pair of contact via structure;
   a pair of active regions electrically connected to the pair of contact via structures forming a pair of active region stacks, wherein the pair of active regions are self-aligned to the contact via structures;
   a pair of gate electrodes between the pair of contact via structures; and
   a planarization dielectric layer, wherein the pair of gate electrodes are formed within the planarization dielectric layer.

10. The interconnect-level structure of claim 9, wherein the pair of contact via structures comprise at least one conductive material.

11. The interconnect-level structure of claim 10, wherein the planarization dielectric layer is planarized by chemical-mechanical polishing to remove excess material of the at least one conductive material.

12. A method of making a field effect transistor comprising:
- depositing a word line in a trench over a buffer layer;
- forming contact via structure;
- depositing a metal layer over the contact via structures;
- depositing a semiconductor channel layer over the contact via structure, metal layer, and buffer layer;
- annealing the metal layer in direct contact with the semiconducting channel layer to form active regions, wherein the active regions are self-aligned to the contact via structures;
- depositing a gate dielectric layer over the buffer layer; and
- depositing and planarizing an interconnect level dielectric layer over the semiconducting channel layer and the buffer layer.

13. The method of claim 12, further comprising forming a lower protection layer over the semiconducting channel layer.

14. The method of claim 12, further comprising depositing a photoresisting layer over the metal layer to mask a portion of the semiconductor channel layer.

15. The method of claim 12, wherein the gate dielectric layer comprises at least one of $SiO_2$, $HfO_2$, $Al_2O_3$, $Ta_2O_5$, $ZrO_2$, $TiO_2$, or combinations thereof.

16. The method of claim 12, further comprising
- forming an interlayer dielectric layer over the semiconducting channel layer;
- forming contact via holes in the interlayer dielectric layer, the contact via holes exposing portions of a top surface of the semiconducting channel layer; and
- wherein depositing the metal layer over the semiconducting channel layer comprises conformally depositing the metal layer over the interlayer dielectric layer, sidewalls of the contact via holes and exposed portions of the top surface of the semiconducting channel layer; and
- wherein annealing the metal layer in direct contact with the semiconducting channel layer also forms a self-aligned passivation protection layer disposed on sidewalls of the contact via holes.

17. The method of claim 12, wherein forming contact via structures comprises filling space in the contact via holes with at least one conductive material, and wherein the interconnect level dielectric layer is planarized by chemical-mechanical polishing to remove excess material of the at least one conductive material.

18. The method of claim 12, wherein forming contact via structures comprises depositing a conductive material in the contact via holes after annealing the metal layer in direct contact with the semiconducting channel layer.

19. The method of claim 12, wherein depositing the metal layer over the semiconducting channel layer comprises conformally depositing the metal layer over the interlayer dielectric layer and on sidewalls of the contact via holes; and
- wherein annealing the metal layer in direct contact with the semiconducting channel layer to form active regions comprises forming a self-aligned passivation protection layer disposed on sidewalls of the contact via structures.

20. The method of claim 12, wherein the semiconducting channel layer comprises a metal oxide semiconducting material.

* * * * *